United States Patent
Kouge et al.

(10) Patent No.: US 10,627,287 B2
(45) Date of Patent: Apr. 21, 2020

(54) THOMSON SCATTERING MEASUREMENT SYSTEM AND EUV LIGHT GENERATION SYSTEM

(71) Applicant: Gigaphoton Inc., Tochigi (JP)

(72) Inventors: Kouichiro Kouge, Oyama (JP); Tatsuya Yanagida, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/435,693

(22) Filed: Jun. 10, 2019

(65) Prior Publication Data

US 2019/0293488 A1  Sep. 26, 2019

Related U.S. Application Data

(63) Continuation of application No. PCT/JP2017/001309, filed on Jan. 17, 2017.

(51) Int. Cl.
| | |
|---|---|
| G01J 1/00 | (2006.01) |
| G01J 1/42 | (2006.01) |
| G01J 3/02 | (2006.01) |
| G01J 3/44 | (2006.01) |
| G03F 7/20 | (2006.01) |

(Continued)

(52) U.S. Cl.
CPC .............. *G01J 1/4257* (2013.01); *G01J 1/429* (2013.01); *G01J 3/024* (2013.01); *G01J 3/0208* (2013.01); *G01J 3/4412* (2013.01); *G01N 21/63* (2013.01); *G03F 7/20* (2013.01); *G03F 7/70033* (2013.01);

(Continued)

(58) Field of Classification Search
USPC ...................................................... 250/504 R
See application file for complete search history.

(56) References Cited

U.S. PATENT DOCUMENTS

| | | | |
|---|---|---|---|
| 5,557,475 A | 9/1996 | Nightingale et al. | |
| 9,253,866 B2 * | 2/2016 | Someya | H05G 2/008 |
| 2017/0280545 A1 * | 9/2017 | Tomita | G01J 3/4412 |

FOREIGN PATENT DOCUMENTS

| | | |
|---|---|---|
| JP | H09-307161 A | 11/1997 |
| JP | H10-502746 A | 3/1998 |

(Continued)

OTHER PUBLICATIONS

Tomita; et.al, "Collective Thomson Scattering Diagnostics of EUV Plasmas", J. Plasma Fusion Res. Series, vol. 8 (2009), pp. 488-491. (Year: 2009).*

(Continued)

*Primary Examiner* — Phillip A Johnston
(74) *Attorney, Agent, or Firm* — Studebaker & Brackett PC

(57) ABSTRACT

A Thomson scattering measurement system according to the present disclosure includes: a transfer optical system provided on an optical path of a slit light beam group generated by division through a slit array and configured to transfer the slit light beam group to a plurality of transfer image groups separated from each other; and a second slit provided on an optical path of light from the transfer image groups and configured to selectively allow light from a plurality of transfer images positioned on a straight line extending in a direction corresponding to a first direction to pass through the second slit, the transfer images corresponding to slit light beams at positions different from each other in a second direction in the slit light beam group among transfer images included in the transfer image groups.

17 Claims, 18 Drawing Sheets

(51) Int. Cl.
    *H05G 2/00*      (2006.01)
    *G01N 21/63*     (2006.01)
    *H05G 1/02*      (2006.01)
(52) U.S. Cl.
    CPC ........... *G03F 7/70575* (2013.01); *H05G 1/02* (2013.01); *H05G 2/008* (2013.01)

(56) References Cited

FOREIGN PATENT DOCUMENTS

| JP | 2011-174886 A | 9/2011 |
| JP | 2014-528084 A | 10/2014 |
| JP | 2016-180733 A | 10/2016 |
| WO | 2004/048943 A1 | 6/2004 |
| WO | 2016/117118 A1 | 7/2016 |

OTHER PUBLICATIONS

International Search Report issued in PCT/JP2017/001309; dated Apr. 11, 2017.
International Preliminary Report on Patentability and Written Opinion issued in PCT/JP2017/001309; dated Jul. 23, 2019.

* cited by examiner

Fig. 21

| MEASUREMENT ITEM | OBTAINED INFORMATION | EXEMPLARY FEEDBACK PARAMETER |
|---|---|---|
| ELECTRON DENSITY $n_e$ | DENSITY (INSUFFICIENT OR EXCESS DENSITY) | 1. TARGET DIAMETER (HIGH DENSITY: DECREASE DIAMETER, LOW DENSITY: INCREASE DIAMETER)<br>2. DELAY TIME OF EACH PULSE (HIGH DENSITY: INCREASE DELAY TIME, LOW DENSITY: DECREASE DELAY TIME) |
| ELECTRON TEMPERATURE $T_e$ | TEMPERATURE (INSUFFICIENT OR EXCESS HEATING) | 1. PULSE ENERGY OF DRIVE PULSE LASER BEAM (HIGH ELECTRON TEMPERATURE: DECREASE PULSE ENERGY, LOW ELECTRON TEMPERATURE: INCREASE PULSE ENERGY)<br>2. PULSE WIDTH OF DRIVE PULSE LASER BEAM (HIGH ELECTRON TEMPERATURE: INCREASE PULSE WIDTH, LOW ELECTRON TEMPERATURE: DECREASE PULSE WIDTH)<br>3. BEAM DIAMETER OF DRIVE PULSE LASER BEAM (HIGH ELECTRON TEMPERATURE: INCREASE BEAM DIAMETER, LOW ELECTRON TEMPERATURE: DECREASE BEAM DIAMETER) |
| SPATIAL DISTRIBUTION ($n_e$, $T_e$) | TARGET DISTRIBUTION AND BEAM DISTRIBUTION (BEAM POSITIONAL SHIFT AND UNUNIFORMITY) | TARGET POSITION (CHANGE OF TARGET TRAJECTORY, CHANGE OF TARGET SPEED)<br>CHANGE OF CONDENSED BEAM PROFILE<br>BEAM POSITION (IRRADIATION TIMING, CHANGE OF LASER CONDENSATION POSITION) |

US 10,627,287 B2

THOMSON SCATTERING MEASUREMENT SYSTEM AND EUV LIGHT GENERATION SYSTEM

CROSS-REFERENCE TO RELATED APPLICATIONS

The present application is a continuation application of International Application No. PCT/JP2017/001309 filed on Jan. 17, 2017. The content of the application is incorporated herein by reference in its entirety.

BACKGROUND

1. Technical Field

The present disclosure relates to a Thomson scattering measurement system and an EUV light generation system.

2. Related Art

Recently, miniaturization of a transfer pattern in optical lithography of a semiconductor process has been rapidly proceeding along with miniaturization of the semiconductor process. Minute fabrication at 20 nm or smaller will be requested in the next generation technology. To meet the request for minute fabrication at 20 nm or smaller, it is desired to develop an exposure device including an extreme ultraviolet light generation device configured to generate extreme ultraviolet (EUV) light at a wavelength of about 13 nm in combination with reduced projection reflective optics.

Disclosed EUV light generation devices include the three kinds of devices of a laser produced plasma (LPP) device that uses plasma generated by irradiating a target material with a pulse laser beam, a discharge produced plasma (DPP) device that uses plasma generated by electrical discharge, and a synchrotron radiation (SR) device that uses synchrotron radiation.

LIST OF DOCUMENTS

Patent Documents

Patent Document 1: International Patent Publication No. 2016/117118
Patent Document 2: National Publication of International Patent Application No. 10-502746
Patent Document 3: Japanese Unexamined Patent Application Publication No. 9-307161

SUMMARY

A Thomson scattering measurement system of the present disclosure includes: a probe laser device configured to output a probe pulse laser beam; a slit array including a plurality of first slits, provided on an optical path of Thomson scattering light generated by irradiation of a plasma region with the probe pulse laser beam, and configured to selectively allow the Thomson scattering light to pass through the first slits to divide the Thomson scattering light into a plurality of slit light beams each having a sectional longitudinal direction along a first direction of the plasma region and generate a slit light beam group of the slit light beams arrayed in a second direction intersecting the first direction; a transfer optical system provided on an optical path of the slit light beam group generated by division through the slit array and configured to transfer the slit light beam group to a plurality of transfer image groups separated from each other; a second slit provided on an optical path of light from the transfer image groups and configured to selectively allow light from a plurality of transfer images positioned on a straight line extending in a direction corresponding to the first direction to pass through the second slit, the transfer images corresponding to slit light beams at positions different from each other in the second direction in the slit light beam group among transfer images included in the transfer image groups; and a spectrometer configured to measure the spectrum waveform of the Thomson scattering light corresponding to an ion term based on the light having passed through the second slit from the transfer images.

An EUV light generation system of the present disclosure includes: a chamber; a target supply device configured to supply a target into the chamber; a drive laser device configured to generate plasma by irradiating the target with a drive pulse laser beam and generate EUV light from the plasma; a probe laser device configured to output a probe pulse laser beam; a slit array including a plurality of first slits, provided on an optical path of Thomson scattering light generated by irradiation of a plasma region with the probe pulse laser beam, and configured to selectively allow the Thomson scattering light to pass through the first slits to divide the Thomson scattering light into a plurality of slit light beams each having a sectional longitudinal direction along a first direction of the plasma region and generate a slit light beam group of the slit light beams arrayed in a second direction intersecting the first direction; a transfer optical system provided on an optical path of the slit light beam group generated by division through the slit array and configured to transfer the slit light beam group to a plurality of transfer image groups separated from each other; a second slit provided on an optical path of light from the transfer image groups and configured to selectively allow light from a plurality of transfer images positioned on a straight line extending in a direction corresponding to the first direction to pass through the second slit, the transfer images corresponding to slit light beams at positions different from each other in the second direction in the slit light beam group among transfer images included in the transfer image groups; and a spectrometer configured to measure the spectrum waveform of the Thomson scattering light corresponding to an ion term based on the light having passed through the second slit from the transfer images.

BRIEF DESCRIPTION OF THE DRAWINGS

Embodiments of the present disclosure will be described below as examples with reference to the accompanying drawings.

FIG. 21 illustrates measurement items of the Thomson scattering measurement system according to Embodiment 1 and exemplary information obtained for the measurement items.

DESCRIPTION OF EMBODIMENTS

<Contents>
<1. Overall Description of EUV Light Generation Device> (FIG. 1)
   1.1 Configuration
   1.2 Operation
<2. Comparative Example> (Thomson Scattering Measurement System) (FIGS. 2 to 5)
   2.1 Configuration
   2.2 Operation
   2.3 Spectrum Waveform of Thomson Scattering Light
   2.4 Problem
<3. Embodiment 1> (Thomson Scattering Measurement System Including Cylindrical Lens Optical System) (FIGS. 6 to 21)
   3.1 Configuration
   3.2 Operation
   3.3 Effects
<4. Embodiment 2> (Thomson Scattering Measurement System Including Wavelength Filter) (FIGS. 22 to 26)
   4.1 Configuration
   4.2 Operation
   4.3 Effects
<5. Others>

Embodiments of the present disclosure will be described below in detail with reference to the accompanying drawings.

The embodiments described below are examples of the present disclosure, and do not limit the contents of the present disclosure. Not all configurations and operations described in each embodiment are necessarily essential as configurations and operations of the present disclosure.

Components identical to each other are denoted by an identical reference sign, and duplicate description thereof will be omitted.

1. Overall Description of EUV Light Generation Device

[1.1 Configuration]

Figure 1:
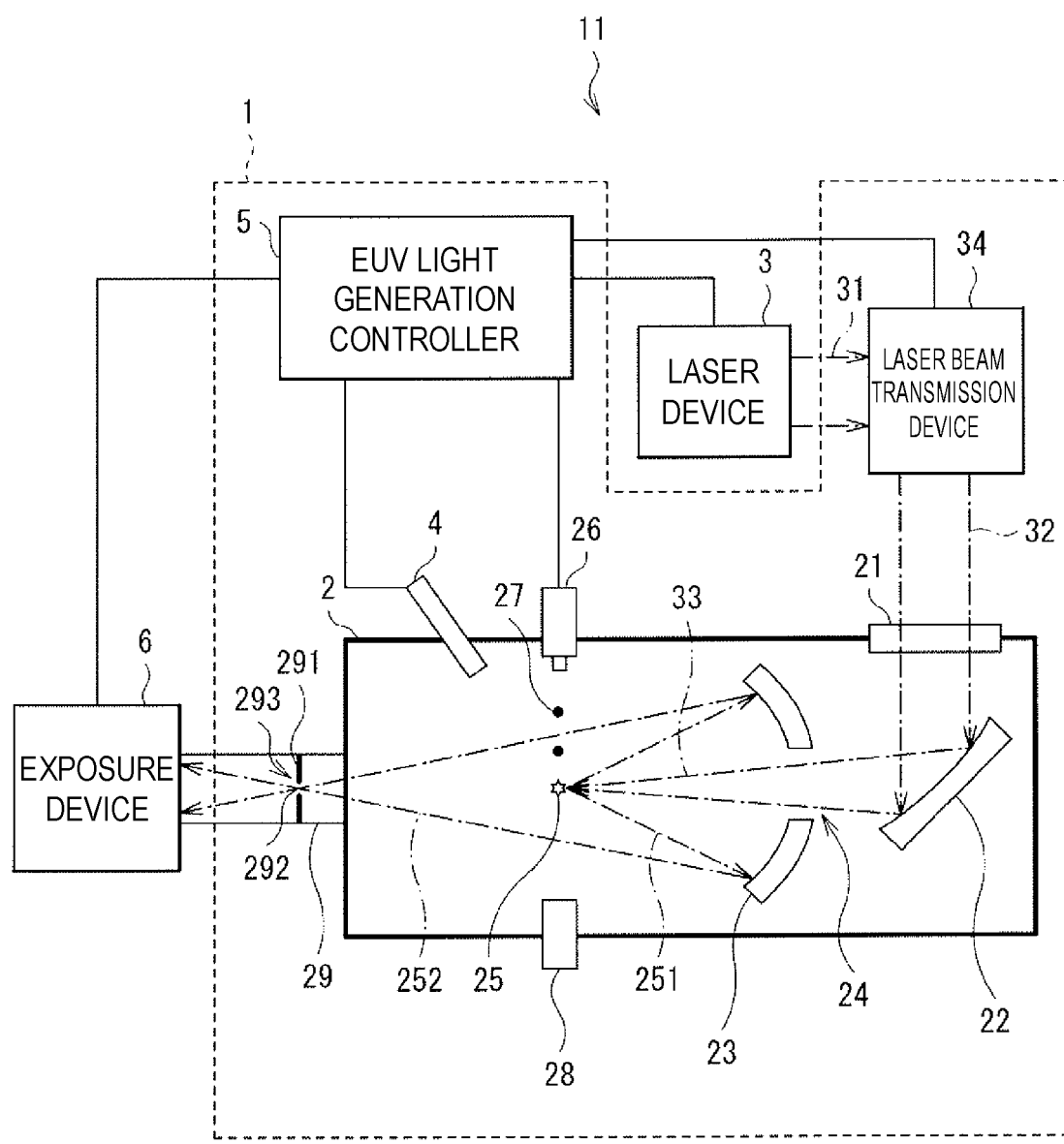
FIG. 1 schematically illustrates an exemplary configuration of an exemplary LPP EUV light generation system.

FIG. 1 schematically illustrates the configuration of an exemplary LPP EUV light generation system. This EUV light generation device 1 is used together with at least one laser device 3 in some cases. In the present application, a system including the EUV light generation device 1 and the laser device 3 is referred to as an EUV light generation system 11. As illustrated in FIG. 1 and described below in detail, the EUV light generation device 1 includes a chamber 2 and a target supply unit 26. The chamber 2 is a sealable container. The target supply unit 26 supplies a target substance into the chamber 2, and is attached through, for example, a wall of the chamber 2. The material of the target substance may contain tin, terbium, gadolinium, lithium, xenon, or a combination of any two or more of the materials, but is not limited thereto.

The wall of the chamber 2 is provided with at least one through-hole. The through-hole is blocked by a window 21 through which a pulse laser beam 32 output from the laser device 3 transmits. For example, an EUV condensation mirror 23 having a spheroidal reflective surface is disposed inside the chamber 2. The EUV condensation mirror 23 has first and second focal points. For example, a multi-layer reflective film in which molybdenum and silicon are alternately stacked is formed on the surface of the EUV condensation mirror 23. The EUV condensation mirror 23 may be disposed so that, for example, the first focal point is positioned in a plasma generation region 25 and the second focal point is positioned at an intermediate focus point (IF) 292. A through-hole 24 is provided at a central part of the EUV condensation mirror 23 so that a pulse laser beam 33 passes through the through-hole 24.

The EUV light generation device 1 includes an EUV light generation controller 5 and a target sensor 4. The target sensor 4 detects one or a plurality of the existence, locus, position, and speed of a target 27. The target sensor 4 may have an image capturing function.

The EUV light generation device 1 includes a connection unit 29 through which the inside of the chamber 2 and the inside of an exposure device 6 are communicated with each other. The connection unit 29 includes a wall 291 through which an aperture 293 is formed provided. The wall 291 is disposed so that the aperture 293 is positioned at the second focal point of the EUV condensation mirror 23.

In addition, the EUV light generation device 1 includes a laser beam transmission device 34, a laser beam condensation mirror 22, and a target collection unit 28 for collecting the target 27. The laser beam transmission device 34 includes an optical element for defining the transmission state of a laser beam, and an actuator for adjusting the position, posture, and the like of the optical element.

[1.2 Operation]

The following describes operation of the exemplary LPP EUV light generation system with reference to FIG. 1. A pulse laser beam 31 output from the laser device 3 passes through the laser beam transmission device 34 and is incident as the pulse laser beam 32 in the chamber 2 through the window 21. The pulse laser beam 32 travels in the chamber 2 along at least one laser beam path, and is reflected by the laser beam condensation mirror 22 and incident as a pulse laser beam 33 on at least one target 27.

The target supply unit 26 outputs the target 27 made of the target substance toward the plasma generation region 25 inside the chamber 2. The target 27 is irradiated with at least one pulse included in the pulse laser beam 33. Plasma is generated from the target 27 irradiated with a pulse laser beam, and radiation light 251 is radiated from the plasma. EUV light 252 included in the radiation light 251 is selectively reflected by the EUV condensation mirror 23. After reflected by the EUV condensation mirror 23, the EUV light 252 is condensed at the intermediate focus point 292 and output to the exposure device 6. One target 27 may be irradiated with a plurality of pulses included in the pulse laser beam 33.

The EUV light generation controller 5 collectively controls the entire EUV light generation system 11. The EUV light generation controller 5 processes a result of detection of the target sensor 4. The EUV light generation controller 5 may control, based on the result of detection of the target sensor 4, for example, the timing at which the target 27 is output, and the direction in which the target 27 is output. In addition, the EUV light generation controller 5 may control, for example, the oscillation timing of the laser device 3, the traveling direction of the pulse laser beam 32, and the condensation position of the pulse laser beam 33. These various kinds of control are merely exemplary, and may include other control as necessary.

<2. Comparative Example> (Thomson Scattering Measurement System)

[2.1 Configuration]

Figure 2:
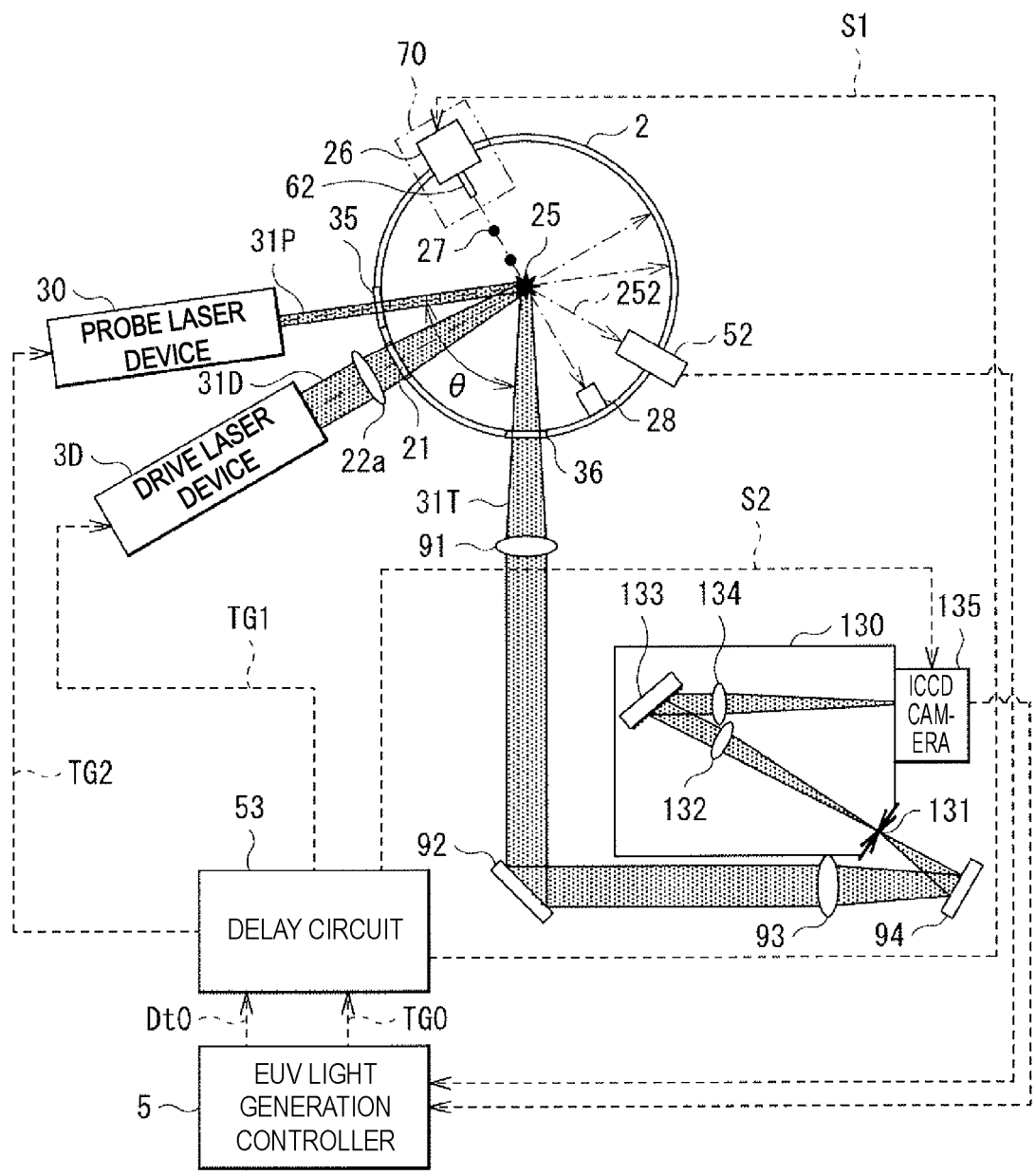
FIG. 2 schematically illustrates an exemplary configuration of a Thomson scattering measurement system according to a comparative example applied to the EUV light generation system.

FIG. 2 schematically illustrates an exemplary configuration of a Thomson scattering measurement system according to a comparative example applied to, for example, the EUV light generation system 11 illustrated in FIG. 1. In the following description, any component substantially identical to that in FIG. 1 is denoted by an identical reference sign, and description thereof will be omitted as appropriate.

The Thomson scattering measurement system may include the chamber 2, the EUV light generation controller 5, a drive laser device 3D, a probe laser device 30, a laser condensation optical system 22a, and a delay circuit 53. The Thomson scattering measurement system may also include a collimator lens 91, a high reflectance mirror 92, a light condensation lens 93, a high reflectance mirror 94, and a spectrometer 130.

The chamber 2 may include the window 21, a window 35, a window 36, the target collection unit 28, an energy sensor 52, and a target supply device 70.

The target supply device 70 may include the target supply unit 26 including a nozzle 62, and be attached to the chamber 2 to supply the target 27 to the plasma generation region 25. The target supply unit 26 may store a target material such as tin. The target supply unit 26 may heat, by a heater (not illustrated), the target material to a predetermined temperature equal to or higher than the melting point of the target material. For example, when the target material is tin having a melting point of 232° C., the target material may be heated to, for example, the temperature of 280° C.

The target supply device 70 may generate the target 27 in a droplet form by an on-demand scheme in response to inputting of a target output signal S1 from the EUV light generation controller 5, and output the target 27 through the nozzle 62. For example, as in the technology of ink jet, the target supply device 70 may generate the target 27 through high voltage pulse application between a lead electrode (not illustrated) and the nozzle 62.

The energy sensor 52 detects the energy of the EUV light 252, and may include a filter (not illustrated) through which the EUV light 252 transmits and a photodiode, and be attached to the chamber 2 to have a detection direction toward the plasma generation region 25.

The target collection unit 28 may be disposed on an extended line of the trajectory of the target 27 supplied from the target supply device 70 and collect the target 27 not turned into plasma and the like.

The window 21 may be fixed to the chamber 2 in a sealed manner on the optical path of a drive pulse laser beam 31D. The window 35 may be fixed to the chamber 2 in a sealed manner on the optical path of a probe pulse laser beam 31P. The window 36 may be fixed to the chamber 2 in a sealed manner on the optical path of Thomson scattering light 31T.

The drive laser device 3D may output the drive pulse laser beam 31D for generating plasma by heating the target 27 and generating the EUV light 252. The drive laser device 3D may be, for example, a $CO_2$ laser device configured to output a pulse laser beam having a wavelength of 10.6 μm. The drive laser device 3D and the laser condensation optical system 22a may be disposed so that the drive pulse laser beam 31D is condensed onto the target 27 supplied to the plasma generation region 25 through the laser condensation optical system 22a and the window 21.

The probe laser device 30 may output the probe pulse laser beam 31P for measuring the Thomson scattering light 31T of plasma generated in the plasma generation region 25. For example, the probe laser device 30 may generate the second harmonic light of a YAG laser configured to oscillate in a single longitudinal mode. The second harmonic light of the YAG laser may have a wavelength of 532.0 nm. The probe laser device 30 may be disposed so that the probe pulse laser beam 31P is incident on, through the window 35, plasma generated in the plasma generation region 25.

The spectrometer 130 may measure the spectrum waveform of the Thomson scattering light 31T corresponding to the ion term. The spectrometer 130 may include an entrance slit 131, a collimator optical system 132, a grating 133, a condensation optical system 134, and an ICCD camera 135. The collimator optical system 132 and the grating 133 may be disposed so that light having transmitted through the entrance slit 131 is collimated through the collimator optical system 132 and incident on the grating 133 at an incident angle α1. The condensation optical system 134 may be disposed so that light diffracted through the grating 133 at a diffraction angle β1 is condensed onto a light-receiving surface of the ICCD camera 135 and a diffraction image of the entrance slit 131 is measured on the light-receiving surface.

The collimator lens 91 may be disposed so that the Thomson scattering light 31T incident through the window 36 is collimated.

The high reflectance mirror 92 may be disposed so that the Thomson scattering light 31T collimated through the collimator lens 91 is incident on the light condensation lens 93.

The light condensation lens 93 may be disposed so that the entrance slit 131 is illuminated with the Thomson scattering light 31T through the high reflectance mirror 94.

The delay circuit 53 may be connected with the target supply device 70 so that the target output signal S1 can be output to the target supply device 70. The delay circuit 53 may be also connected with the drive laser device 3D so that a drive pulse light emission trigger TG1 can be output to the drive laser device 3D. The delay circuit 53 may be also connected with the probe laser device 30 so that a probe pulse light emission trigger TG2 can be output to the probe laser device 30. The delay circuit 53 may be also connected with the ICCD camera 135 so that a shutter signal S2 can be output to the ICCD camera 135.

The EUV light generation controller 5 may be connected with the delay circuit 53 and the ICCD camera 135.

[2.2 Operation]

The EUV light generation controller 5 may output, to the delay circuit 53, delay data Dt0 indicating a delay time of each of the target output signal S1, the drive pulse light emission trigger TG1, the probe pulse light emission trigger TG2, and the shutter signal S2. The EUV light generation controller 5 may also output a trigger signal TG0 to the delay circuit 53 so that the above-described signals are each generated at a predetermined delay time.

First, when the target output signal S1 is input to the target supply device 70, the target 27 in the droplet form is output from the nozzle 62 of the target supply device 70. When the drive pulse light emission trigger TG1 is input to the drive laser device 3D, a drive pulse laser beam 31D is output from the drive laser device 3D. When having reached the plasma generation region 25, the target 27 is irradiated with the drive pulse laser beam 31D through the laser condensation optical system 22a. As a result, plasma is generated from the target 27, and the EUV light 252 is generated from the plasma. The energy sensor 52 may detect the energy of the EUV light 252 and output a detected value to the EUV light generation controller 5.

When the probe pulse light emission trigger TG2 is input to the probe laser device 30, the probe pulse laser beam 31P is output from the probe laser device 30 so that the plasma is irradiated with the probe pulse laser beam 31P. The Thomson scattering light 31T of the probe pulse laser beam 31P from the plasma is transmitted through the collimator lens 91, the high reflectance mirror 92, the light condensation lens 93, and the high reflectance mirror 94, and incident on the entrance slit 131 of the spectrometer 130. The Thomson scattering light 31T having passed through the entrance slit 131 is collimated through the collimator optical system 132 and incident on the grating 133 so that diffracted light is generated. The diffracted light through the grating 133 is condensed on the light-receiving surface of the ICCD camera 135 through the condensation optical system 134. As a result, a diffraction image of the entrance slit 131 is formed on the light-receiving surface of the ICCD camera 135.

When the shutter signal S2 is input to the ICCD camera 135, the shutter of the ICCD camera 135 is opened at the timing at which the shutter signal S2 is input, and remains opened for a time corresponding to the pulse width of the shutter signal S2 so that an image corresponding to the time is measured. The diffraction angle of the diffracted light differs with wavelength, and thus the spectrum waveform of the Thomson scattering light 31T corresponding to the ion term when the shutter signal S2 is input is measured on the light-receiving surface of the ICCD camera 135. The ICCD camera 135 may output the measured result as image data to the EUV light generation controller 5.

[2.3 Spectrum Waveform of Thomson Scattering Light]

Figure 3:
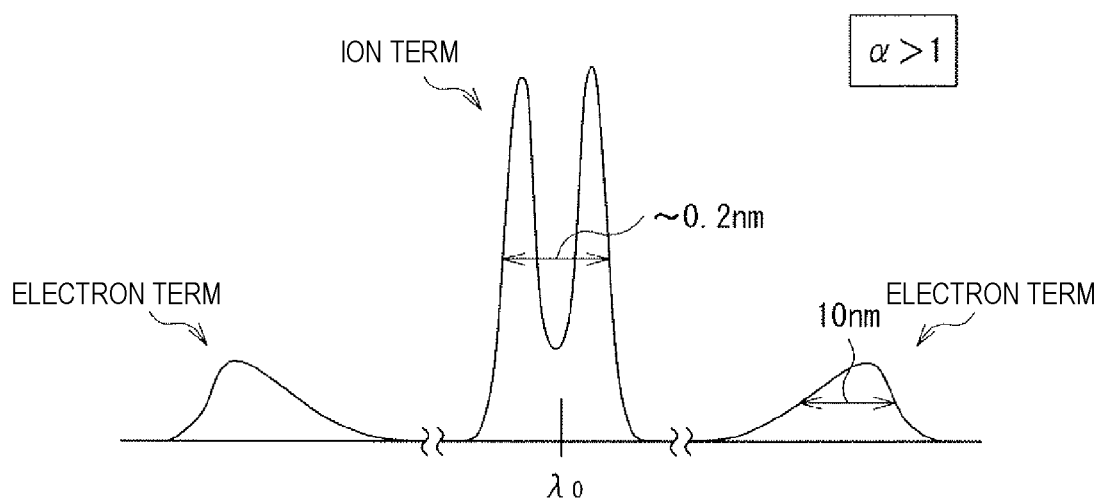
FIG. 3 schematically illustrates an exemplary spectrum waveform of Thomson scattering light when a scattering parameter satisfies $\alpha$ is greater than 1.
Figure 4:
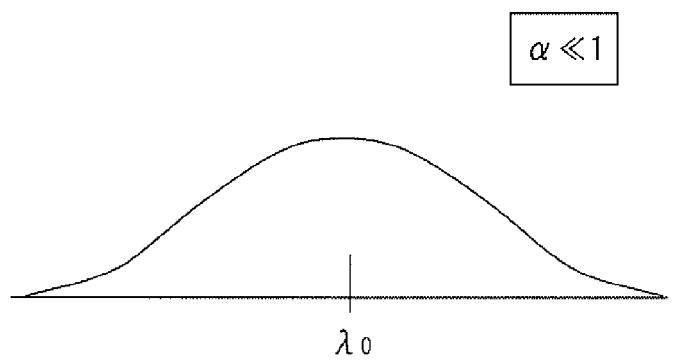
FIG. 4 schematically illustrates an exemplary spectrum waveform when the scattering parameter satisfies $\alpha$ is much less than 1.

The following describes the spectrum waveform of the Thomson scattering light 31T with reference to FIGS. 3 and 4. FIG. 3 schematically illustrates an exemplary spectrum waveform of the Thomson scattering light 31T when a scattering parameter α described below satisfies that α is greater than 1. FIG. 4 schematically illustrates an exemplary spectrum waveform when the scattering parameter α satisfies that α is much less than 1. In FIGS. 3 and 4, the horizontal axis represents a difference wavelength Δλ having a central wavelength at a wavelength $\lambda_0$ of the probe pulse laser beam 31P, and the vertical axis represents signal intensity.

The scattering parameter α of the Thomson scattering light 31T can be given by an equation below. In the equation below, $\lambda_D$ represents the Debye length, k represents the wavenumber, $\lambda_0$ represents the wavelength of the probe pulse laser beam 31P, θ represents the scattering angle, $n_e$ represents the electron density, $T_e$ represents the electron temperature, $\varepsilon_0$ represents the vacuum dielectric constant, and e represents the elementary charge.

$$\alpha = \frac{1}{k\lambda_D} = \frac{\lambda_0}{4\pi\sin(\theta/2)}\left(\frac{n_e e^2}{\varepsilon_0 e T_e}\right)^{1/2} \quad \text{[Expression 1]}$$

The case in which α is greater than 1 is referred to as collective scattering, which means scattering due to collective motion of electrons. The case in which α is much less than 1 is referred to as incoherent scattering, which means a scattering cross-sectional area due to plasma is determined by thermal motion of individual electrons only.

The spectrum waveform of the Thomson scattering light 31T of plasma from which the EUV light 252 is generated can indicate the collective scattering. In the incoherent scattering, only the spectrum waveform corresponding to the electron term is observed as illustrated in FIG. 4, but in the collective scattering, the spectrum waveform corresponding to the ion term and the electron term is observed as illustrated in FIG. 3. In the collective scattering, spectra corresponding to the ion term and the electron term are each symmetrically observed on the short wavelength side and the long wavelength side of the wavelength $\lambda_0$ of the probe pulse laser beam 31P.

(Plasma Parameter Determination Method)

The spectrum waveform corresponding to the ion term at a wavelength close to the wavelength $\lambda_0$ of the probe pulse laser beam 31P is observed with strong signal intensity. Thus, a plasma parameter can be highly accurately estimated by measuring the ion term. The valence Z, the electron density $n_e$, the electron temperature $T_e$, and the ion temperature $T_i$ can be calculated from the shape of the spectrum waveform corresponding to the ion term, a peak wavelength for the ion term, and the signal intensity by measuring the spectrum waveform corresponding to the ion term. The values of Z and $T_e$ can be separately calculated from theoretical table values of a CR model based on the value of $Z \cdot T_e$.

The spectrum waveform corresponding to the ion term can be characterized by a parameter $\beta$ expressed by an equation below. A ratio R of a central recessed part of the ion term in FIG. 3 and a peak value is, for example, 2, 3, 5, and 10 when $\beta$ is 1.5, 2, 2.5, and 3, respectively. A specific spectrum function $S(k, \Delta\lambda)$ of the Thomson scattering light 31T is described in detail in Section 5.2 or 5.3 of Chapter 5 of a reference literature below.

Reference literature: D. H. Froula, S. H. Glenzer, N. C. Luhmann, Jr., and J. Sheffield: Plasma Scattering of Electromagnetic Radiation (Academic Press, USA, 2011) 2nd ed.

$$\beta = \sqrt{\frac{\alpha^2}{1+\alpha^2} \frac{ZT_e}{T_i}} \qquad \text{[Expression 2]}$$

In the reference literature, the spectrum function is a function of a frequency difference $\Delta\omega$ (simply referred to as $\omega$ in the literature) in place of the difference wavelength $\Delta\lambda$, but an equation below can be used for conversion from $\Delta\omega$ to $\Delta\lambda$.

$$\Delta\lambda = \{\lambda_0^2/(2\pi c)\}\Delta\omega$$

A peak wavelength $\Delta\lambda_p$ for the ion term can be given by an equation below. The peak wavelength $\Delta\lambda_p$ of the equation below may be a difference amount from the wavelength $\lambda_0$ of the probe pulse laser beam 31P. In the expression, $\kappa$ represents the Boltzmann constant, and $M_i$ represents the ion mass.

$$\Delta\lambda_p = \frac{\lambda_0^2 k}{2\pi c} \sqrt{\frac{\kappa(ZT_e + 3T_i)}{M_i}} \qquad \text{[Expression 3]}$$

The absolute value of the electron density $n_e$ can be obtained by calibrating a total intensity $I_T$ of the ion term of Thomson scattering with intensity $I_R$ of Rayleigh scattering performed when argon gas having a known density is encapsulated in the same chamber. A specific formula can be given by an equation below.

$$n_e = \frac{I_T}{I_R} \frac{\sigma_R}{\sigma_T S_i} n_0 \qquad \text{[Expression 4]}$$

In the expression, $n_0$ represents the density of the argon gas, $\sigma_R$ represents the cross-sectional area of Rayleigh scattering of the argon gas, $\sigma_T$ represents the total cross-sectional area of Thomson scattering, and $S_i$ represents the integration value of the spectrum function corresponding to the ion term over the difference wavelength, which can be given by an equation below.

$$S_i = \frac{Z\alpha^4}{(1+\alpha^2)\{1+\alpha^2(1+ZT_e/T_i)\}} \qquad \text{[Expression 5]}$$

The ratio of the cross-sectional area of Rayleigh scattering of the argon gas relative to the total cross-sectional area of Thomson scattering may be $$\sigma_R/\sigma_T = 1100$$

in this case.

[2.4 Problem]

With the Thomson scattering measurement system according to the comparative example, only one-dimensional measurement can be performed in the traveling direction of the probe pulse laser beam 31P. Thus, to spatially perform plasma Thomson scattering measurement, in other words, to perform two-dimensional measurement, measurement needs to be performed a plurality of times while shifting the position of the probe pulse laser beam 31P. This may lead to increase in the measurement time. In addition, it is difficult to perform two-dimensional measurement on the same plasma, which may lead to decrease of the reliability of a measurement result.

Figure 5:
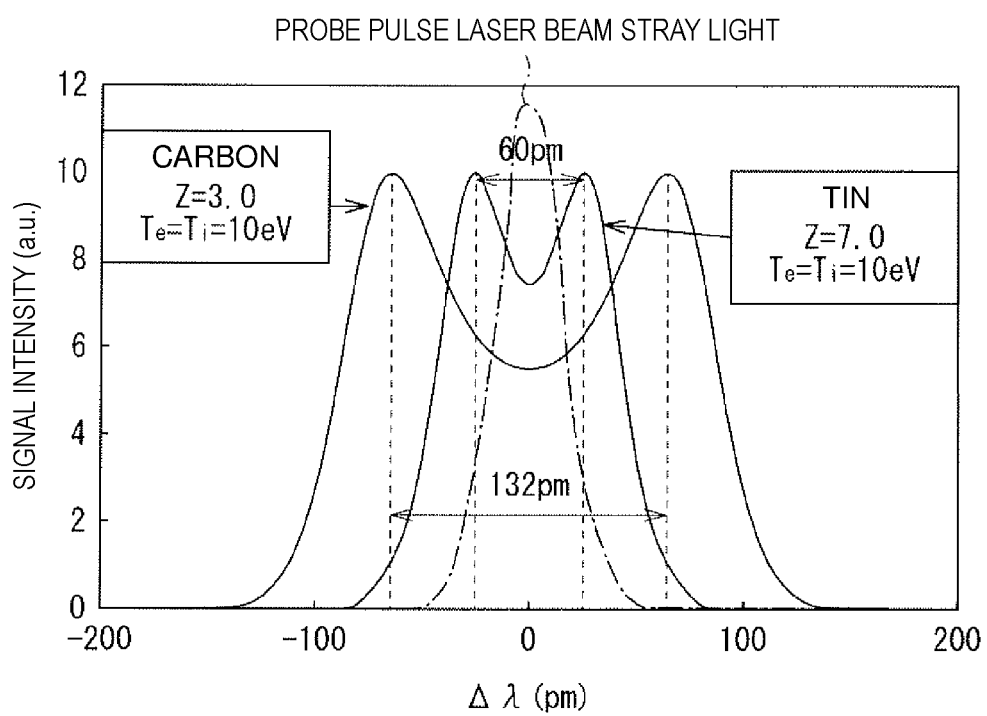
FIG. 5 schematically illustrates exemplary spectrum waveforms of stray light of a probe pulse laser beam and the Thomson scattering light corresponding to an ion term.

Moreover, in the Thomson scattering measurement system according to the comparative example, stray light of the probe pulse laser beam 31P may cause problem. FIG. 5 schematically illustrates exemplary spectrum waveforms of stray light of the probe pulse laser beam 31P and the Thomson scattering light 31T corresponding to the ion term. In FIG. 5, the horizontal axis represents the difference wavelength $\Delta\lambda$ having a central wavelength at the wavelength $\lambda_0$ of the probe pulse laser beam 31P, and the vertical axis represents the signal intensity. FIG. 5 schematically illustrates exemplary spectrum waveforms when the target 27 is carbon and tin.

When the ion term is measured by the typical spectrometer 130, the spectrum waveform of synthesis of the ion term and the stray light of the probe pulse laser beam 31P is measured as illustrated in FIG. 5 since the stray light of the probe pulse laser beam 31P is large. Thus, it is difficult to highly accurately measure the ion term. In particular, when the target 27 is tin, a difference $\Delta\lambda$p between two peak wavelengths measured as the ion term is small at 60 pm, and thus it is difficult to separate the spectrum waveforms of the ion term and the stray light of the probe pulse laser beam 31P.

<3. Embodiment 1> (Thomson Scattering Measurement System Including Cylindrical Lens Optical System)

The following describes a Thomson scattering measurement system according to Embodiment 1 of the present disclosure. In the following description, any component substantially identical to that of the Thomson scattering measurement system according to the comparative example described above is denoted by an identical reference sign, and description thereof will be omitted as appropriate.

[3.1 Configuration]

Figure 6:
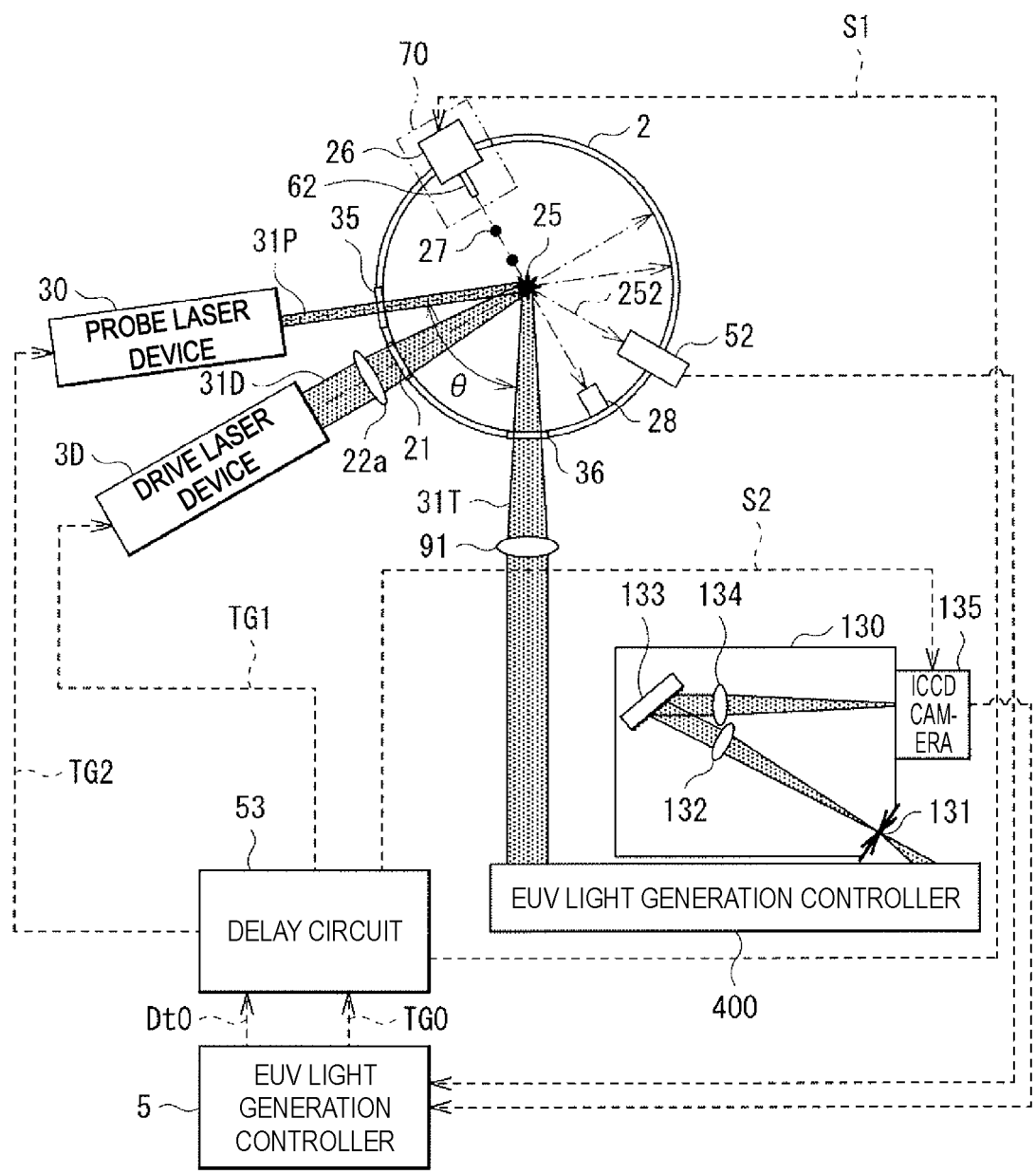
FIG. 6 schematically illustrates an exemplary configuration of a Thomson scattering measurement system according to Embodiment 1 applied to the EUV light generation system.

FIG. 6 schematically illustrates an exemplary configuration of the Thomson scattering measurement system according to Embodiment 1 applied to the EUV light generation system 11.

The Thomson scattering measurement system according to Embodiment 1 includes a cylindrical lens optical system 400 in place of the light condensation lens 93 in the Thomson scattering measurement system according to the comparative example. In the Thomson scattering measurement system according to Embodiment 1, Thomson scattering light 31T is guided to the entrance slit 131 through the cylindrical lens optical system 400 in place of the light condensation lens 93.

Figure 7:
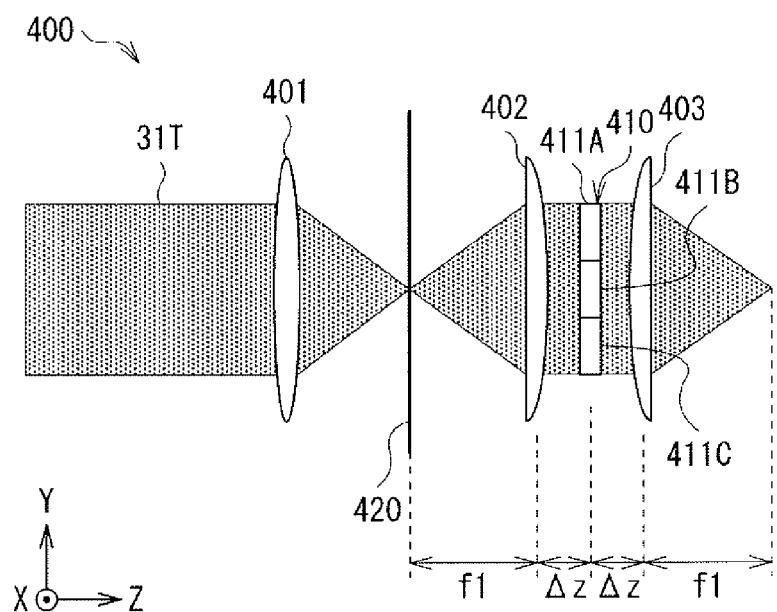
FIG. 7 schematically illustrates an exemplary configuration of a cylindrical lens optical system in the Thomson scattering measurement system according to Embodiment 1.

FIG. 7 schematically illustrates an exemplary configuration of the cylindrical lens optical system 400.

The cylindrical lens optical system 400 includes a light condensation lens 401, a slit array 420, a cylindrical lens 402, a cylindrical lens 403, and a cylindrical lens array 410.

The light condensation lens 401 is a condensation optical system through which the Thomson scattering light 31T is condensed onto the slit array 420.

The cylindrical lens array 410 includes a plurality of cylindrical lenses 411A, 411B, and 411C. The cylindrical lenses 411A, 411B, and 411C may be a plurality of first cylindrical lenses in the present disclosure.

The cylindrical lens 402 may be a second cylindrical lens in the present disclosure. The cylindrical lens 403 may be a third cylindrical lens in the present disclosure.

In FIG. 7, an X axis, a Y axis, and a Z axis are defined as follows. The same definition applies to the following other drawings.

The X axis is the optical axis of the probe pulse laser beam 31P in a scattering light image of the Thomson scattering light 31T formed through the light condensation lens 401. The X axis has a positive direction on the window 35 side in the scattering light image formed through the light condensation lens 401.

The Y axis is orthogonal to the X axis and the Z axis. The Y axis has a positive direction on the target supply device 70 side in the scattering light image formed through the light condensation lens 401.

The Z axis is the optical axis of the Thomson scattering light 31T. The Z axis has a positive direction along the traveling direction of the Thomson scattering light 31T.

The cylindrical lens array 410 is installed while being slightly rotated about the Z axis as described later, but the rotation is not illustrated in FIG. 7. The cylindrical lens optical system 400 may include a high reflectance mirror that bends, by 90°, the optical path of the Thomson scattering light 31T collimated through the collimator lens 91 in FIG. 6, which is not illustrated in FIG. 7.

(Exemplary Configuration of Slit Array 420)

Figure 8:
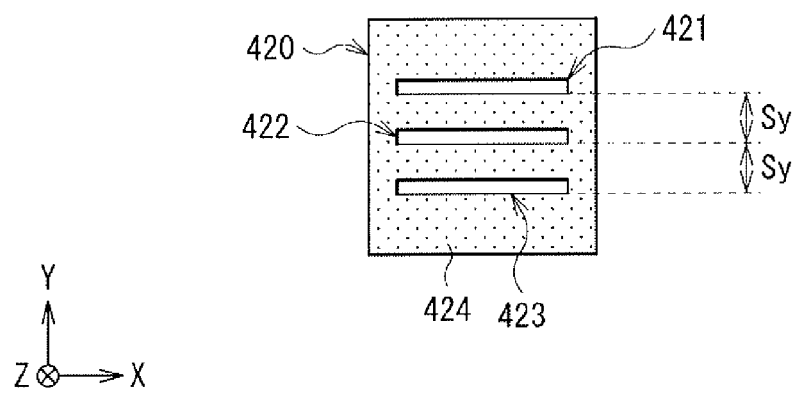
FIG. 8 schematically illustrates an exemplary configuration of a slit array in the cylindrical lens optical system.

FIG. 8 schematically illustrates an exemplary configuration of the slit array 420 in the cylindrical lens optical system 400.

The slit array 420 includes a plurality of slits 421, 422, and 423. The slits 421, 422, and 423 may be a plurality of first slits in the present disclosure.

The slits 421, 422, and 423 are arranged in a direction orthogonal to the longitudinal direction. The slit array 420 is provided on the optical path of the Thomson scattering light 31T generated by irradiation of a plasma region with the probe pulse laser beam 31P. The slit array 420 selectively allows the Thomson scattering light 31T to pass through the slits 421, 422, and 423 to divide the Thomson scattering light 31T into a plurality of slit light beams each having a sectional longitudinal direction along a first direction of the plasma region. Accordingly, the slit array 420 generates a slit light beam group of a plurality of slit light beams arrayed in a second direction intersecting the first direction. The sectional longitudinal direction is the longitudinal direction of an XY section orthogonal to the Z axis as the optical axis of each slit light beam.

The first direction may be the X-axis direction. The second direction may be the Y-axis direction. The slit light beam group corresponds to a scattering light image Im10 in FIG. 16 to be described later. The slit light beams correspond to a plurality of divided scattering light images Im1, Im2, and Im3 in FIG. 16 to be described later.

The dimensions and the like of parts of the slit array 420 may have, for example, representative values as follows. The slits 421, 422, and 423 may each have a slit width of, for example, 200 μm. The slits 421, 422, and 423 may each have a slit length of, for example, 7.6 mm. A slit interval Sy may be, for example, 1.5 mm. Here, these values apply when the collimator lens 91 and the light condensation lens 401 have an imaging magnification of seven.

The material of the slit array 420 may be any material that can shield the Thomson scattering light 31T in a shield region 424. The material of the slit array 420 may be, for example, stainless steel (SUS), copper, ceramic, or an aluminum alloy. The surface of the slit array 420 may be provided with no treatment but may be provided with, as treatment against stray light from an optical system, low-temperature black chromium treatment in a case of SUS or inorganic black alumite treatment in a case of an aluminum alloy.

(Exemplary Configurations of Cylindrical Lenses 402 and 403 and Cylindrical Lens Array 410)

Figure 9:
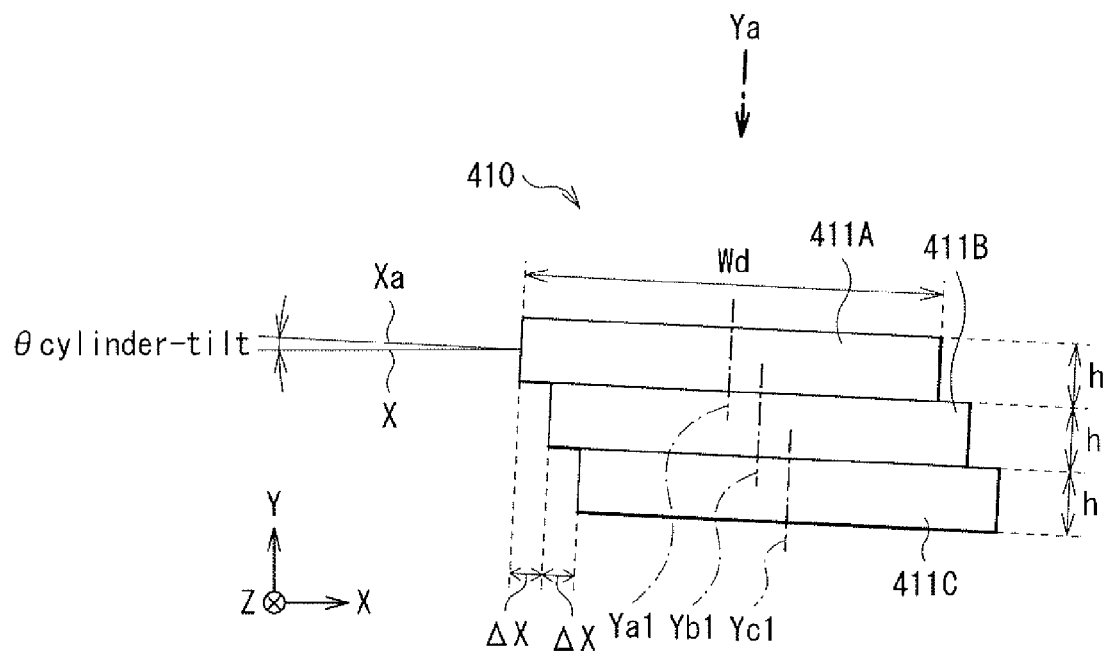
FIG. 9 schematically illustrates an exemplary configuration of a cylindrical lens array when viewed in the optical axis direction of the Thomson scattering light.
Figure 10:
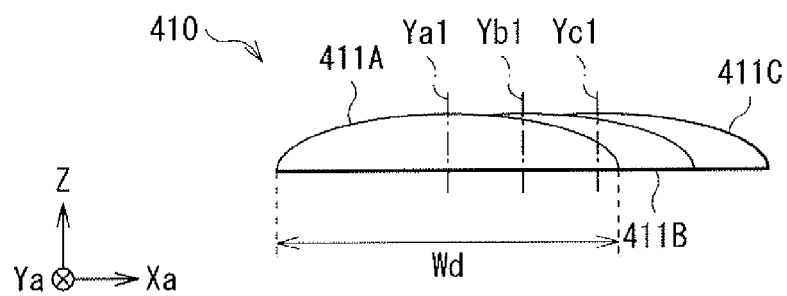
FIG. 10 schematically illustrates an exemplary configuration of the cylindrical lens array when viewed in an axial direction parallel to the barrel axis of a cylindrical lens.

FIG. 9 schematically illustrates an exemplary configuration of the cylindrical lens array 410 when viewed in the optical axis of the Thomson scattering light 31T direction. FIG. 10 schematically illustrates an exemplary configuration of the cylindrical lens array 410 when viewed in an axial direction Ya parallel to barrel axes Ya1, Yb1, and Yc1 of the cylindrical lenses 411A, 411B, and 411C. The barrel axes Ya1, Yb1, and Yc1 may be parallel to edge lines of the cylindrical lenses 411A, 411B, and 411C, respectively. In FIG. 10, an axis Xa may be orthogonal to the barrel axes Ya1, Yb1, and Yc1 of the cylindrical lenses 411A, 411B, and 411C. The same definition applies to the following other drawings.

The cylindrical lens 402 is disposed on an optical path between the slit array 420 and the cylindrical lens array 410. The cylindrical lens 403 is disposed on an optical path between the cylindrical lens array 410 and the entrance slit 131. The cylindrical lenses 402 and 403 each have curvature in the Y-axis direction. The dimensions and the like of the cylindrical lenses 402 and 403 may have, for example, representative values as follows. The cylindrical lens 402 and the cylindrical lens 402 are disposed so that the barrel axis of the cylindrical lens 402 and the barrel axis of the cylindrical lens 403 are substantially parallel to the longitudinal direction of the slits 421, 422, and 423 of the slit array 420.

The cylindrical lenses 402 and 403 may each have a width of 50 mm in the X-axis direction. The cylindrical lenses 402 and 403 may each have a height of, for example, 50 mm in the Y-axis direction. The cylindrical lenses 402 and 403 may each have a focal length f1. The distance Δz between the cylindrical lens 402 and the cylindrical lens array 410 may be, for example, 20 mm. Similarly, the distance Δz between the cylindrical lens 403 and the cylindrical lens array 410 may be, for example, 20 mm.

The cylindrical lens 402, the cylindrical lens array 410, and the cylindrical lens 403 may be a transfer optical system provided on the optical path of the slit light beam group generated by division through the slit array 420 and configured to transfer the slit light beam group to a plurality of transfer image groups separated from each other.

Figure 16:
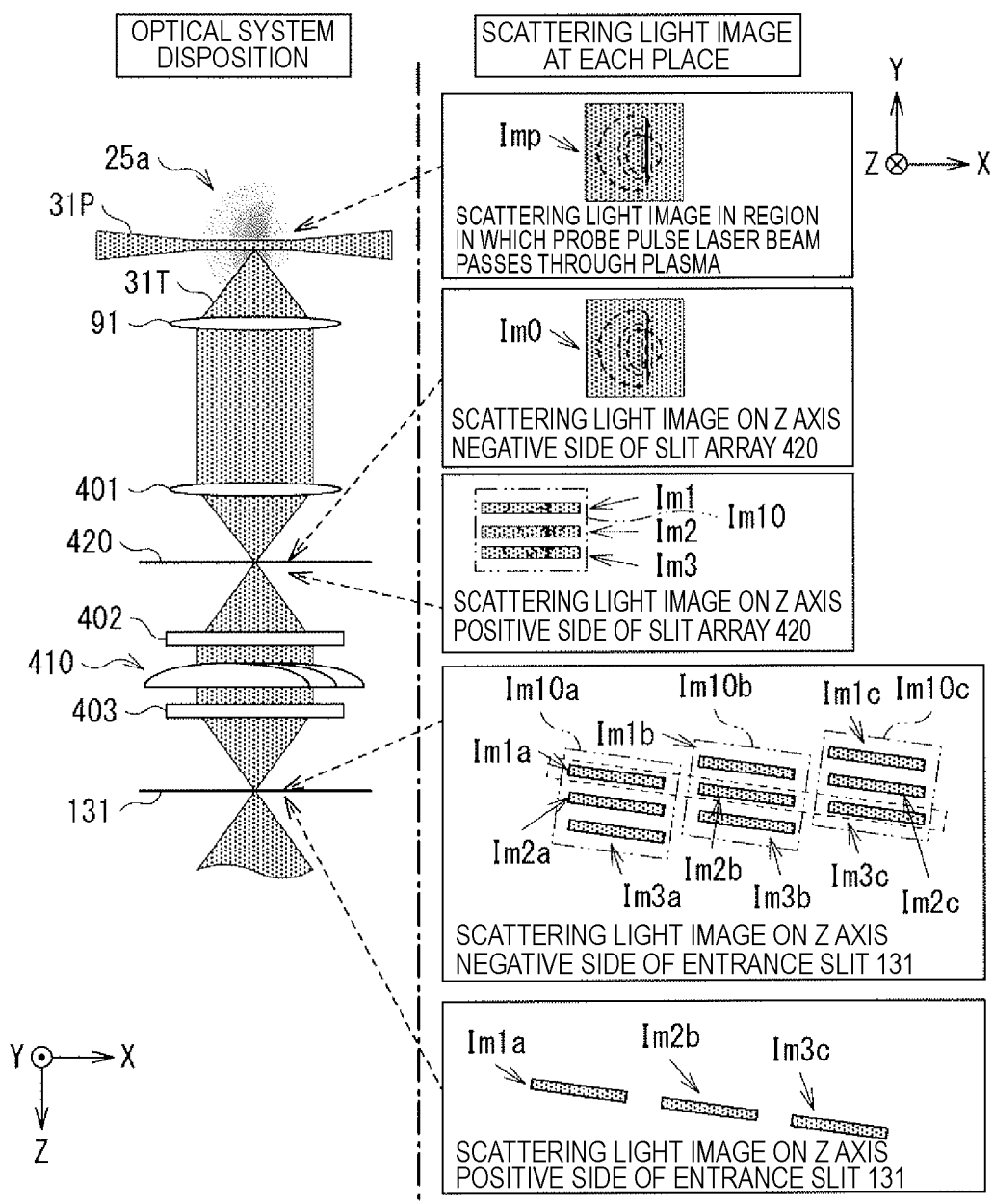
FIG. 16 schematically illustrates a scattering light image at each place in the Thomson scattering measurement system according to Embodiment 1.

Each transfer image group may be a plurality of scattering light images Im10a, Im10b, and Im10c in FIG. 16 to be described later. The scattering light image Im10a includes, as a plurality of transfer images, a plurality of divided scattering light images Im1a, Im2a, and Im3a as illustrated in FIG. 16 to be described later. The scattering light image Im10b includes, as a plurality of transfer images, a plurality of divided scattering light images Im1b, Im2b, and Im3b as illustrated in FIG. 16 to be described later. The scattering light image Im10c includes, as a plurality of transfer images, a plurality of divided scattering light images Im1c, Im2c, and Im3c as illustrated in FIG. 16 to be described later.

The cylindrical lenses 411A, 411B, and 411C are disposed so that the barrel axes Ya1, Yb1, and Yc1 thereof are separated from each other.

The cylindrical lenses 411A, 411B, and 411C are disposed so that an axis orthogonal to the optical path axis of the Thomson scattering light 31T and the barrel axes Ya1, Yb1, and Yc1 of the cylindrical lenses 411A, 411B, and 411C is tilted relative to the longitudinal direction of the slits 421, 422, and 423 of the slit array 420 with a rotation center at the optical path axis of the Thomson scattering light 31T.

The cylindrical lenses 411A, 411B, and 411C are disposed in parallel to each other in the direction of the barrel axes Ya1, Yb1, and Yc1 of the cylindrical lenses 411A, 411B, and 411C. The number of the cylindrical lenses 411A, 411B, and 411C is equal to the number of the slits 421, 422, and 423 of the slit array 420.

The cylindrical lenses 411A, 411B, and 411C are each disposed at a position rotated about the optical axis of the Thomson scattering light 31T by $\theta_{cylinder-tilt}$. The cylindrical lenses 411A, 411B, and 411C are disposed at such positions that the axes thereof are shifted from each other by $\Delta x$ in the Xa axial direction orthogonal to the barrel axes Ya1, Yb1, and Yc1.

The cylindrical lenses 402 and 403 each have an imaging effect only in one direction. The direction of the imaging effect is same for the cylindrical lenses 402 and 403. The direction in which the cylindrical lenses 402 and 403 have the imaging effects is orthogonal to but is shifted from the direction in which the cylindrical lenses 411A, 411B, and 411C have imaging effects by $\theta_{cylinder-tilt}$.

The dimension and the like of parts of the cylindrical lens array 410 may have, for example, representative values as follows. The angle $\theta_{cylinder-tilt}$ may be, for example, 2.5°. The cylindrical lenses 411A, 411B, and 411C may each have a width Wd of, for example, 50 mm. The cylindrical lenses 411A, 411B, and 411C may each have a size h of, for example, 3.5 mm. When $\Delta x$ represents the interval between the barrel axes of two adjacent cylindrical lenses among the cylindrical lenses 411A, 411B, and 411C, $\Delta x$ may be, for example, 4.5 mm.

The cylindrical lenses 411A, 411B, and 411C may each have a focal length of $(f1+\Delta z)/2$. The material of each of the cylindrical lenses 411A, 411B, and 411C may be optical glass having high transmissivity at the wavelength of the probe pulse laser beam 31P. For example, the material may be N-BK7 manufactured by Schott AG when the wavelength of the probe pulse laser beam 31P is 532 nm.

Figure 11:
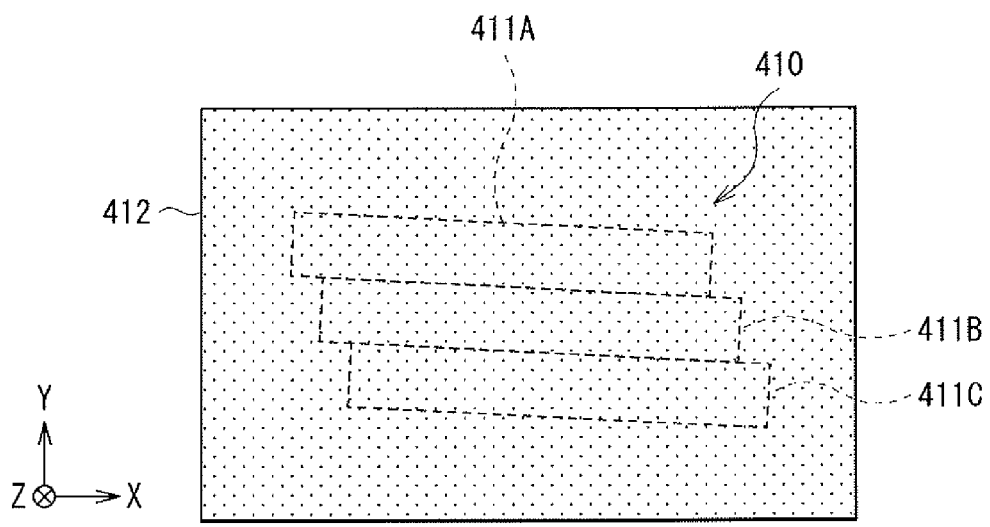
FIG. 11 schematically illustrates a first specific exemplary configuration of the cylindrical lens array when viewed in the optical axis direction of the Thomson scattering light.
Figure 12:
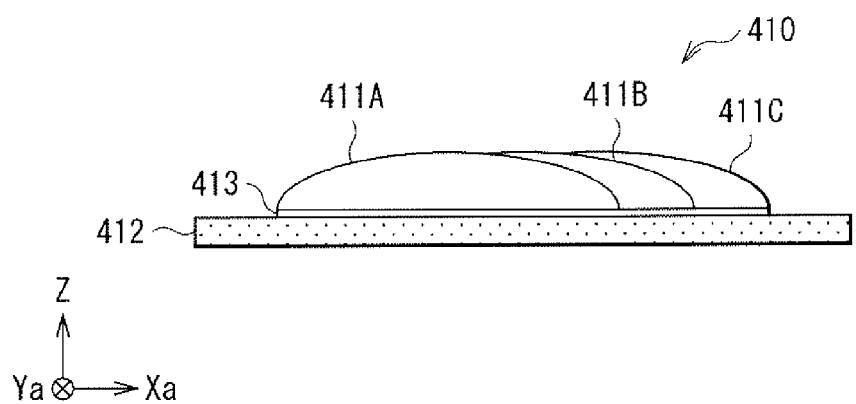
FIG. 12 schematically illustrates the first specific exemplary configuration of the cylindrical lens array when viewed in an axial direction parallel to the barrel axis of the cylindrical lens.

FIG. 11 schematically illustrates a first specific exemplary configuration of the cylindrical lens array 410 when viewed in the optical axis of the Thomson scattering light 31T direction. FIG. 12 schematically illustrates the first specific exemplary configuration of the cylindrical lens array 410 when viewed in an axial direction parallel to the barrel axes Ya1, Yb1, and Yc1 of the cylindrical lenses 411A, 411B, and 411C.

The cylindrical lens array 410 may be formed by bonding the cylindrical lenses 411A, 411B, and 411C onto a parallel plane board 412 through a resin material such as ultraviolet curable resin 413. In this case, the material of each of the cylindrical lenses 411A, 411B, and 411C is preferably optical glass having high transmissivity at the wavelength of the probe pulse laser beam 31P. For example, the material may be N-BK7 manufactured by Schott AG when the wavelength of the probe pulse laser beam 31P is 532 nm.

The ultraviolet curable resin 413 preferably has high transmissivity at the wavelength of the probe pulse laser beam 31P. For example, the resin may be NOA 60 or NOA 61 manufactured by NORLAND PRODUCTS INCORPORATED when the wavelength of the probe pulse laser beam 31P is 532 nm.

The material of the parallel plane board 412 is preferably optical glass having high transmissivity at the wavelength of the probe pulse laser beam 31P. For example, the material may be N-BK7 manufactured by Schott AG when the wavelength of the probe pulse laser beam 31P is 532 nm.

Figure 13:
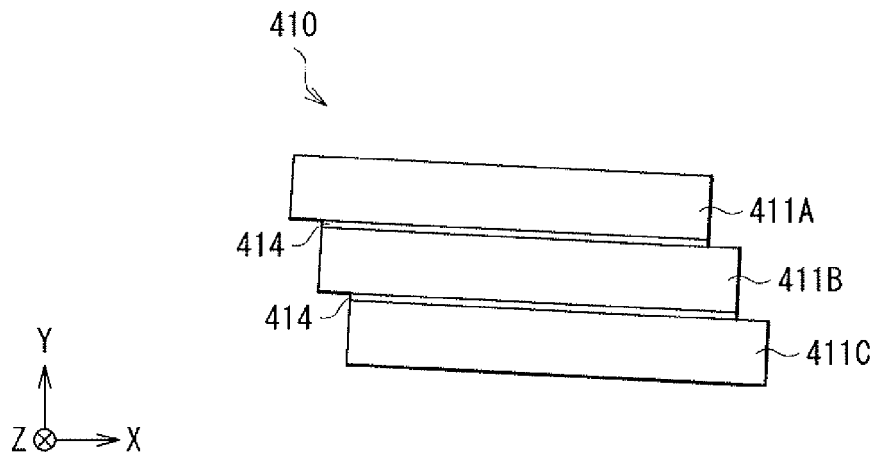
FIG. 13 schematically illustrates a second specific exemplary configuration of the cylindrical lens array when viewed in the optical axis direction of the Thomson scattering light.
Figure 14:
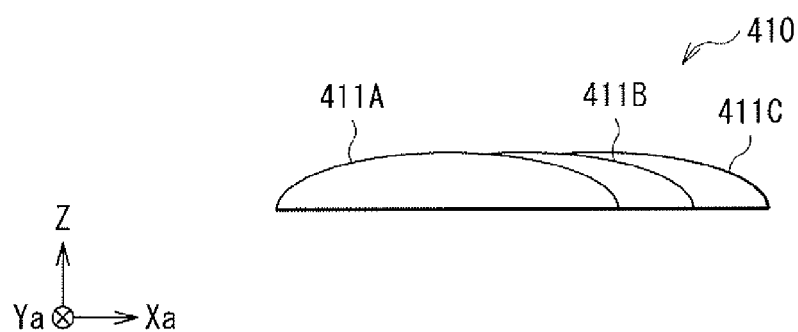
FIG. 14 schematically illustrates the second specific exemplary configuration of the cylindrical lens array when viewed in an axial direction parallel to the barrel axis of the cylindrical lens.

FIG. 13 schematically illustrates a second specific exemplary configuration of the cylindrical lens array 410 when viewed in the optical axis of the Thomson scattering light 31T direction. FIG. 14 schematically illustrates the second specific exemplary configuration of the cylindrical lens array 410 when viewed in the axial direction parallel to the barrel axes Ya1, Yb1, and Yc1 of the cylindrical lenses 411A, 411B, and 411C.

The cylindrical lens array 410 may be formed by bonding two adjacent cylindrical lenses among the cylindrical lenses 411A, 411B, and 411C to each other through a resin material such as ultraviolet curable resin 414. In this case, the ultraviolet curable resin 414 preferably has high transmissivity at the wavelength of the probe pulse laser beam 31P. For example, the resin may be NOA 60 or NOA 61 manufactured by NORLAND PRODUCTS INCORPORATED when the wavelength of the probe pulse laser beam 31P is 532 nm.

(Exemplary Configuration of Entrance Slit 131)

Figure 15:
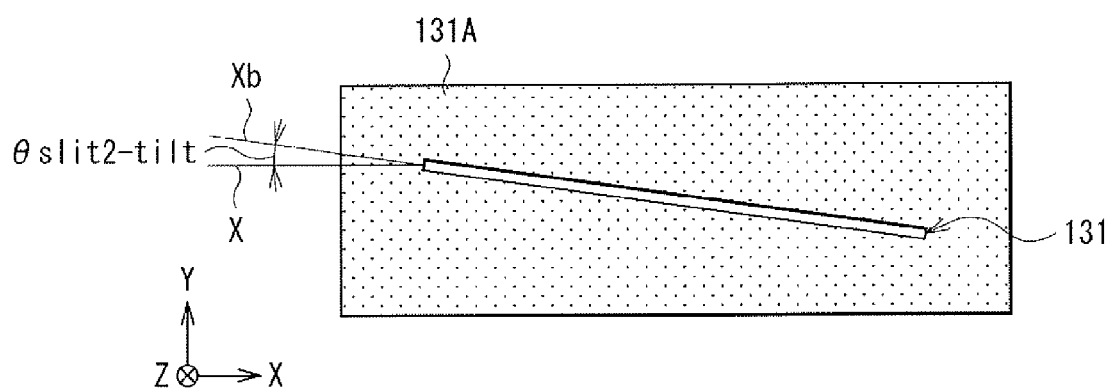
FIG. 15 schematically illustrates an exemplary configuration of an entrance slit in the Thomson scattering measurement system according to Embodiment 1.

FIG. 15 schematically illustrates an exemplary configuration of the entrance slit 131.

The entrance slit 131 may be a second slit in the present disclosure. The entrance slit 131 is provided on the optical path of light from the transfer image groups. The entrance slit 131 selectively allows light from a plurality of transfer images positioned on a straight line extending in a direction corresponding to the first direction to pass through the entrance slit 131, the transfer images corresponding to slit light beams at positions different from each other in the second direction in the slit light beam group among transfer images included in the transfer image groups.

The spectrometer 130 measures the spectrum waveform of the Thomson scattering light 31T corresponding to the ion term based on the light having passed through the entrance slit 131 from the transfer images.

The transfer images that the entrance slit 131 selectively allows to pass through the entrance slit 131 correspond to the divided scattering light image Im1a, the divided scattering light image Im2b, and the divided scattering light image Im3c illustrated at a right lower part in FIG. 16 to be described later.

The entrance slit 131 is disposed so that the longitudinal direction thereof is tilted relative to the longitudinal direction of the slits 421, 422, and 423 of the slit array 420 with a rotation center at the optical path axis of the Thomson scattering light 31T.

The dimension and the like of parts of the entrance slit 131 may have, for example, representative values as follows. The angle θslit2-tilt may be, for example, 7.6°. The entrance slit 131 may have a slit width of, for example, 20 µm. The entrance slit 131 may have a slit length, for example, of 60 mm.

(Preferable Configuration of Each Component)

The interval $\Delta x$ illustrated in FIG. 9, in other words, the interval $\Delta x$ between two of the barrel axes Ya1, Yb1, and Yc1 corresponding to two adjacent cylindrical lenses among the cylindrical lenses 411A, 411B, and 411C preferably satisfies an expression below. In the expression, Wx (mm) represents the size of each slit light beam in the longitudinal direction of the slits 421, 422, and 423 of the slit array 420, in other words, the dimension of each scattering light image on the slit array 420 in the X-axis direction. In addition, $N_A$ represents the imaging magnification of each of the cylindrical lenses 411A, 411B, and 411C.

$$\Delta x \geq \{N_A/(N_A+1)\} \times Wx$$

It is preferable that $\Delta x$ is in the above-described range to completely separate images formed by the respective cylindrical lenses 411A, 411B, and 411C on the entrance slit 131 in effect. In addition, it is preferable that the cylindrical lenses 411A, 411B, and 411C are disposed to all have a substantially equal interval $\Delta x$ between two of the barrel axes Ya1, Yb1, and Yc1 corresponding to two adjacent cylindrical lenses.

When the value h illustrated in FIG. 9 is too large, the Thomson scattering light 31T passes through only some of the lenses included in the cylindrical lens array 410, and thus the value needs to have an appropriate magnitude. The value h preferably satisfies an expression below. In the expression, $\phi_{col}$ represents the effective opening diameter of the collimator lens 91, $f_{col}$ represents the effective focal length of the collimator lens 91, $\phi_{focus}$ (=$\phi_{col}$) represents the effective opening diameter of the light condensation lens 401, $f_{focus}$ represents the effective focal length of the light condensation lens 401, $N_{slit}$ represents the number of slits included in the slit array 420, f1 represents the focal length of the cylindrical lens 402, and $\Delta z$ represents the interval between the cylindrical lens 402 and the cylindrical lens array 410 in the Z-axis direction.

$$h \leq (f1+\Delta z) \times \{(\phi_{focus}/2)/f_{focus}\} \times 1/N_{slit}$$

When the value Wd illustrated in FIG. 9 is too small, the Thomson scattering light 31T passes through only some of the lenses included in the cylindrical lens array 410 due to the axial shift $\Delta x$ in some cases, and thus the value Wd needs to have a lower limit. The value Wd preferably satisfies an expression below. In the expression, $\phi_{col}$ represents the effective opening diameter of the collimator lens 91, $f_{col}$ represents the effective focal length of the collimator lens 91, $\phi_{focus}$ (=$\phi_{col}$) represents the effective opening diameter of the light condensation lens 401, $f_{focus}$ represents the effective focal length of the light condensation lens 401, $N_{slit}$ represents the number of slits included in the slit array 420, f1 represents the focal length of the cylindrical lens 402, and $\Delta z$ represents the interval between the cylindrical lens 402 and the cylindrical lens array 410 in the Z-axis direction.

$$Wd \geq (f1+\Delta z) \times \{(\phi_{focus}/2)/f_{focus}\} + \{(N_{slit}-1)/2\} \times \Delta x$$

The rotation angle $\theta_{cylinder-tilt}$ about the Z axis of the cylindrical lens array 410 illustrated in FIG. 9 is preferably equal to or smaller than 5°.

The magnification of the cylindrical lens optical system 400 is basically the same magnification but is not particularly limited.

The length of each of the slits 421, 422, and 423 of the slit array 420 in the longitudinal direction is preferably equal to or larger than Wx when a scattering light image formed on the surface of the slit array 420 has dimensions of Wx (mm) in the X-axis direction and Wy (mm) in the Y-axis direction.

The slit width of each of the slits 421, 422, and 423 of the slit array 420 is preferably 200 µm or smaller.

The other configuration may be substantially same as that of the Thomson scattering measurement system according to the comparative example described above.

[3.2 Operation]

FIG. 16 schematically illustrates a scattering light image at each place in the Thomson scattering measurement system according to Embodiment 1. FIG. 16 illustrates, on the left side, disposition of an optical system such as the cylindrical lens optical system 400.

FIG. 16 schematically illustrates, on the right side, a scattering light image at each place of the optical system. Specifically, FIG. 16 illustrates a scattering light image Imp in a region in which the probe pulse laser beam 31P passes through plasma 25a, a scattering light image Im0 on the Z axis negative side of the slit array 420, and the scattering light image Im10 on the Z axis positive side of the slit array 420. FIG. 16 also illustrates the scattering light images Im10a, Im10b, and Im10c on the Z axis negative side of the entrance slit 131, and the divided scattering light images Im1a, Im2b, and Im3c on the Z axis positive side of the entrance slit 131.

The Thomson scattering light 31T collimated through the collimator lens 91 is imaged on the slit array 420 through the light condensation lens 401.

The slit array 420 allows the Thomson scattering light 31T from some regions inside the plasma to transmit therethrough. Each region is long in a direction along the probe pulse laser beam 31P and narrow in a direction orthogonal thereto. The scattering light image Im10 on the Z axis positive side of the slit array 420 includes the divided scattering light images Im1, Im2, and Im3 corresponding to the slits 421, 422, and 423.

The cylindrical lens 402 collimates, only in one direction, the Thomson scattering light 31T having passed through the slit array 420.

The cylindrical lens array 410 images, on a surface on which the entrance slit 131 is positioned only in one direction, the Thomson scattering light 31T having passed through the slit array 420 and the cylindrical lens 402. The cylindrical lens array 410 forms divided scattering light images in a number equal to the number of the slits 421, 422, and 423 of the slit array 420. The images are shifted from each other in the horizontal direction in proportion to $\Delta x$ and tilted in accordance with $\theta_{cylinder-tilt}$.

The cylindrical lens 403 condenses, only in one direction, the Thomson scattering light 31T having passed through the cylindrical lens 402, the slit array 420, and the cylindrical lens array 410.

Among the scattering light images Im10a, Im10b, and Im10c on the Z axis negative side of the entrance slit 131, the scattering light image Im10a includes the divided scattering light images Im1a, Im2a, and Im3a as a plurality of transfer images. The scattering light image Im10b includes the divided scattering light images Im1b, Im2b, and Im3b as a plurality of transfer images. The scattering light image Im10c includes the divided scattering light images Im1c, Im2c, and Im3c as a plurality of transfer images.

The entrance slit 131 allows only the divided scattering light images Im1a, Im2b, and Im3c obliquely arranged on a straight line to pass through the entrance slit 131 among the divided scattering light images included in the scattering light images Im10a, Im10b, and Im10c on the Z axis negative side of the entrance slit 131. The divided scattering light images Im1a, Im2b, and Im3c correspond to the divided scattering light images Im1, Im2, and Im3 included in the scattering light image Im10 on the Z axis positive side of the slit array 420, which are originally two-dimensionally disposed. The divided scattering light images Im1, Im2, and Im3, which are originally two-dimensionally disposed, are obtained as the divided scattering light images Im1a, Im2b, and Im3c, which are one-dimensionally disposed.

(Measurement Result of Spectrum Waveform of Thomson Scattering Light 31T)

Figure 17:
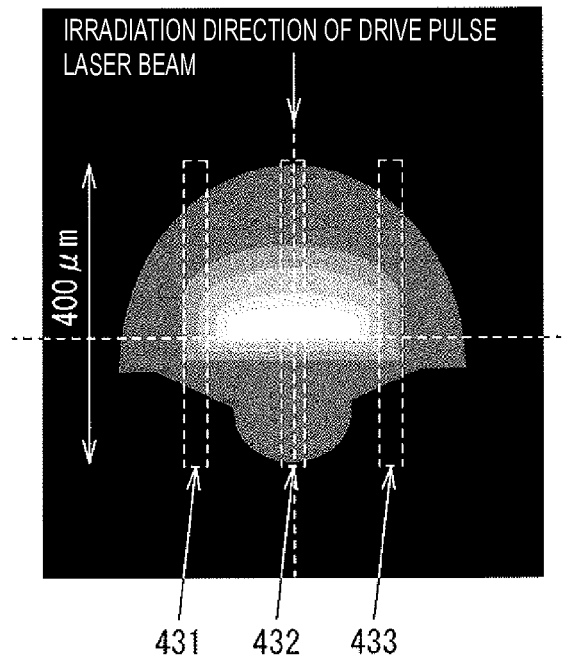
FIG. 17 schematically illustrates an image of the light emission state of EUV light in the Thomson scattering measurement system according to Embodiment 1.
Figure 18:
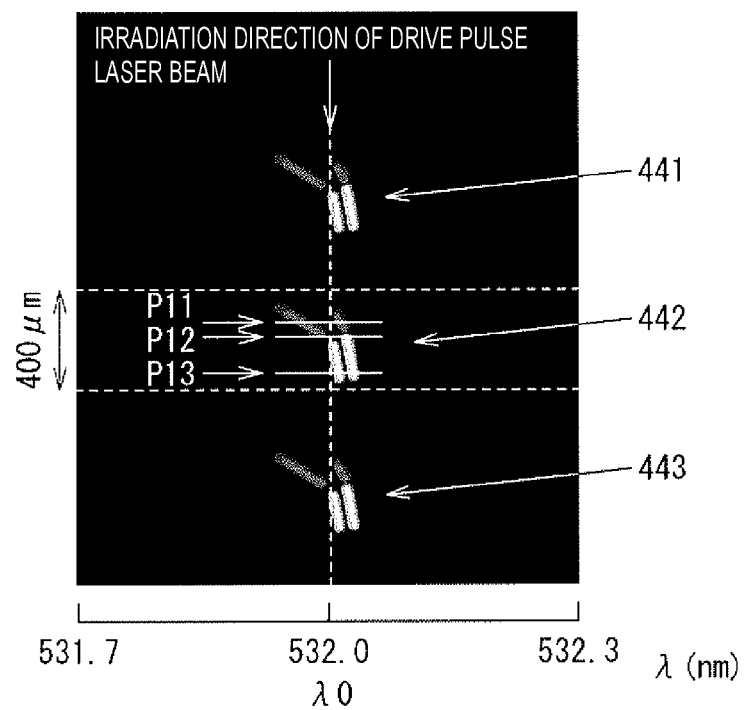
FIG. 18 schematically illustrates a spectrum image of the Thomson scattering light corresponding to the ion term in the Thomson scattering measurement system according to Embodiment 1.
Figure 19:
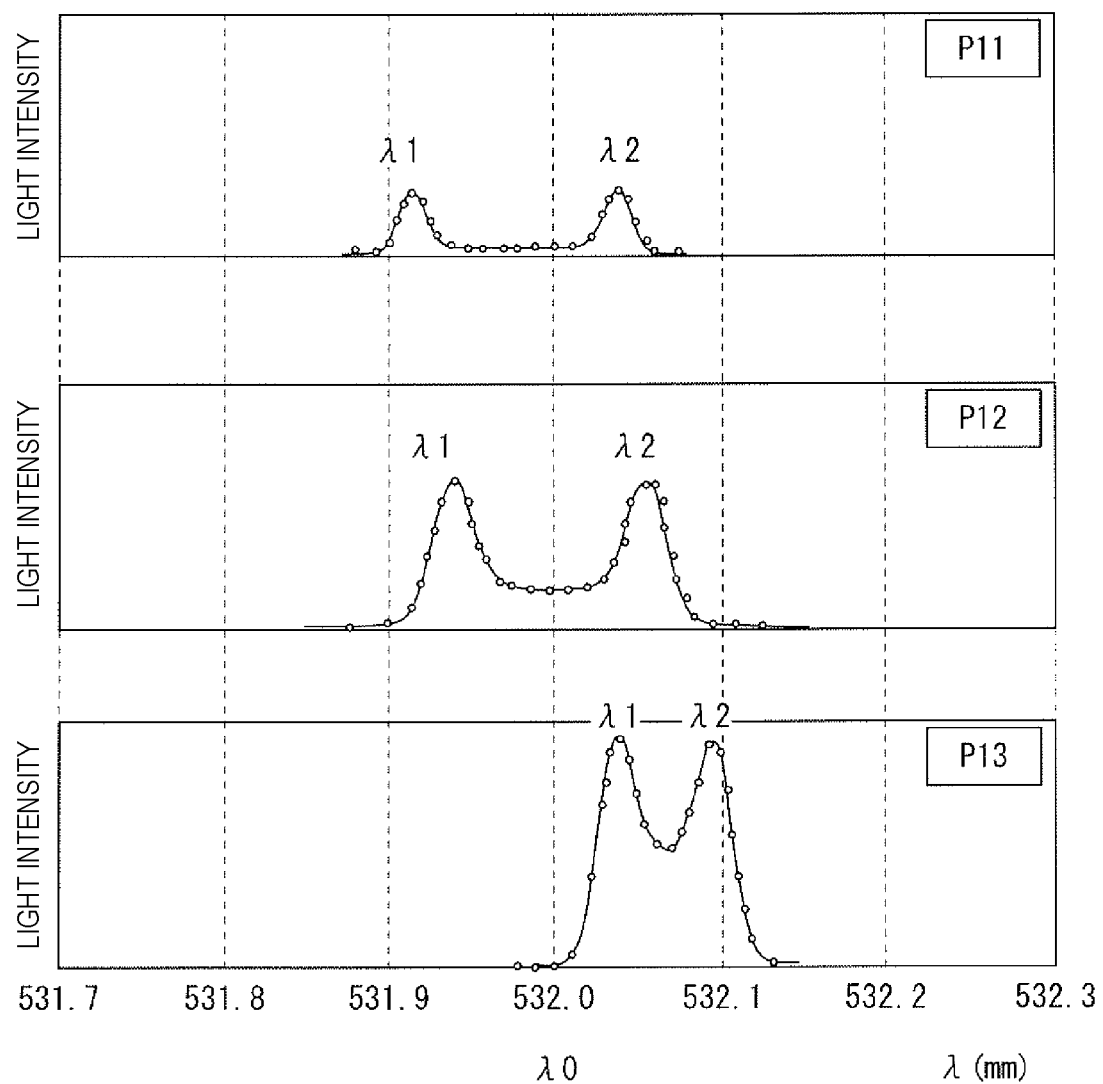
FIG. 19 schematically illustrates spectrum waveforms at positions P11, P12, and P13 in FIG. 18.

The following describes an exemplary measurement result of the spectrum waveform of the Thomson scattering light 31T corresponding to the ion term in Embodiment 1 with reference to FIGS. 17 to 19. FIG. 17 schematically illustrates an image of a light emission state of the EUV light 252 in the Thomson scattering measurement system according to Embodiment 1. FIG. 18 schematically illustrates a spectrum image of the Thomson scattering light 31T corresponding to the ion term in the Thomson scattering measurement system according to Embodiment 1. In FIG. 18, the longitudinal direction represents position, and the lateral direction represents wavelength.

The spectrum measurement result illustrated in FIG. 18 is obtained when the Thomson scattering light 31T having passed through the entrance slit 131 is subjected to wavelength separation at the spectrometer 130. As illustrated in FIG. 16, the divided scattering light images Im1a, Im2b, and Im3c of the Thomson scattering light 31T corresponding to respective regions 431, 432, and 433 illustrated in FIG. 17 are linearly arranged through the cylindrical lens optical system 400. Spectrum images 441, 442, and 443 corresponding to the regions 431, 432, and 433 illustrated in FIG. 17 are linearly arranged on the spectrum image of the Thomson scattering light 31T corresponding to the ion term obtained by the spectrometer 130. Spectrum analysis is performed on each of the spectrum images 441, 442, and 443.

FIG. 19 schematically illustrates spectrum waveforms at positions P11, P12, and P13 on the spectrum image 442 in FIG. 18 corresponding to the region 432 in FIG. 17.

In FIG. 19, $\lambda 1$ and $\lambda 2$ represent two peak wavelengths of the spectrum waveform of the ion term where $\lambda 1$ is shorter than $\lambda 2$. Their average value $\lambda av$ $(=(\lambda 1+\lambda 2)/2)$ may be calculated.

In FIG. 19, the solid curve may be obtained by calculating a spectrum of the ion term from the plasma parameter and calculating the convolution integral thereof with a device function of the spectrometer 130. The plasma parameter may include the ion valence Z, the electron density $n_e$, the electron temperature $T_e$, and the ion density Ti. As illustrated in FIG. 19, the solid curve as a calculated value substantially matches with measured values.

A measurement time and the plasma parameter at a measurement position of the plasma 25a can be calculated through the calculation as described above. In FIG. 19, the average value $\lambda av$ of the two peak wavelengths of the ion term is shifted from the wavelength $\lambda_0$ of the probe pulse laser beam 31P because of the Doppler effect of light due to ion movement. Thus, the moving direction and speed v of ions can be estimated from the average value $\lambda av$ of the two peak wavelengths of the ion term. The ion speed v can be calculated by Expression (1) below indicating the Doppler effect of light. In Expression (1), c represents the speed of light.

$$\lambda av = \lambda_0 (1-v/c)/(1-v^2/c^2)^{0.5} \quad (1)$$

The ions hardly move at the position P12 at which the average value $\lambda av$ of the two peak wavelengths of the ion term substantially matches with the wavelength $\lambda_0$ of the probe pulse laser beam 31P, and thus the position P12 is thought to be the central position of the plasma 25a. It is thought that the ions move toward the emission side of the drive pulse laser beam 31D at the position P11 upstream of the central position, and the ions move in the traveling direction of the drive pulse laser beam 31D at the position P13 downstream of the central position.

(Exemplary Control of Thomson Scattering Measurement)

Figure 20:
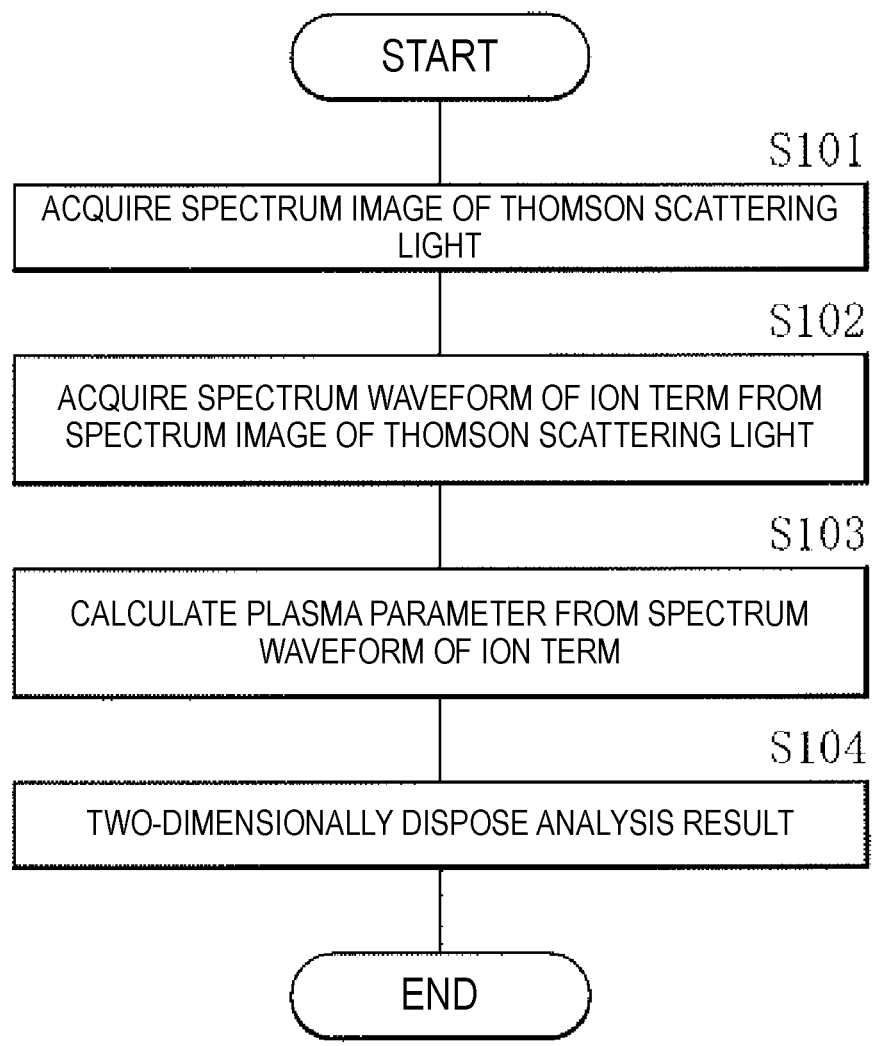
FIG. 20 is a flowchart illustrating an exemplary process of measuring the Thomson scattering light in the Thomson scattering measurement system according to Embodiment 1.

FIG. 20 illustrates exemplary control of measurement of the Thomson scattering light 31T in the Thomson scattering measurement system according to Embodiment 1.

The EUV light generation controller 5 acquires a spectrum image of the Thomson scattering light 31T (step S101).

Subsequently, the EUV light generation controller 5 acquires the spectrum waveform of the ion term from the spectrum image of the Thomson scattering light 31T (step S102). The correspondence relation between a position in the longitudinal direction on the image in FIG. 18 and a spatial position in plasma in FIG. 17 is determined in advance depending on disposition of the cylindrical lens optical system 400.

Subsequently, the EUV light generation controller 5 calculates the plasma parameter from the spectrum waveform of the ion term (step S103). The plasma parameter may include the ion valence Z, the electron density $n_e$, the electron temperature $T_e$, and the ion density Ti.

The EUV light generation controller 5 two-dimensionally disposes an analysis result (step S104).

FIG. 21 illustrates measurement items of the Thomson scattering measurement system and exemplary information obtained for the measurement items. The measurement items may include the electron density $n_e$, the electron temperature $T_e$, and the spatial distribution ($n_e$, $T_e$). The EUV light generation controller 5 may perform feedback control of each component in accordance with a measurement result of the plasma parameter.

The information obtained from the measurement item of the electron density $n_e$ may include density information, for example, information on whether the density is insufficient or excess. The information obtained from the measurement item of the electron temperature $T_e$ may include temperature information, for example, information on whether heating is insufficient or excess. The information obtained from the measurement item of the spatial distribution ($n_e$, $T_e$) may include target distribution and beam distribution information, for example, information on beam positional shift and beam ununiformity.

Feedback parameters of the electron density $n_e$ may include information on a target diameter and delay times $\Delta T1$-2 and $\Delta T1$-3. Feedback parameters of the electron temperature $T_e$ may include information on the pulse energy, pulse width, and a beam diameter of the drive pulse laser beam 31D.

Feedback parameters of the spatial distribution ($n_e$, $T_e$) may include a target position, change of a condensed beam profile, and a beam position. The target position may include, for example, information on change of the trajectory of the target 27 and change of the speed of the target 27. The beam position may include, for example, information on an irradiation timing and change of a laser condensation position.

The other operation may be substantially same as that of the Thomson scattering measurement system according to the comparative example described above.

[3.3 Effects]

According to the Thomson scattering measurement system according to Embodiment 1, the Thomson scattering light 31T from regions extending in a direction along the incident direction of the probe pulse laser beam 31P and separated from each other in a direction orthogonal to the incident direction is linearly imaged and incident on the spectrometer 130. This configuration leads to reduction of the measurement time of spatially performing plasma Thomson scattering measurement. In addition, the plasma Thomson scattering measurement can be spatially performed on the same plasma, which leads to improved reliability of the measurement.

<4. Embodiment 2> (Thomson Scattering Measurement System Including Wavelength Filter)

The following describes a Thomson scattering measurement system according to Embodiment 2 of the present disclosure. In the following description, any component substantially identical to that of the Thomson scattering measurement system according to the comparative example or Embodiment 1 described above is denoted by an identical reference sign, and description thereof will be omitted as appropriate.

[4.1 Configuration]

Figure 22:
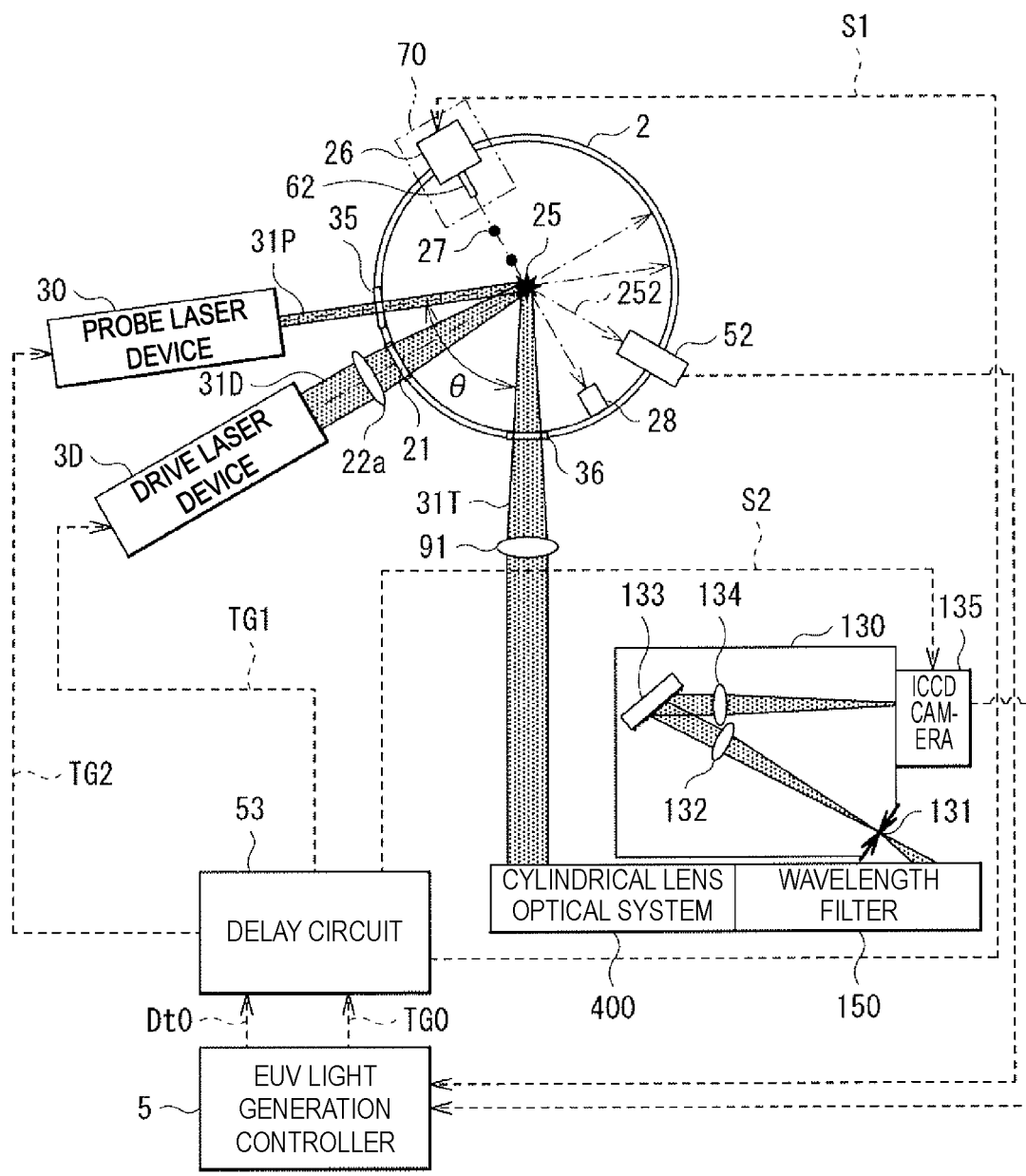
FIG. 22 schematically illustrates an exemplary configuration of a Thomson scattering measurement system according to Embodiment 2 applied to the EUV light generation system.

FIG. 22 schematically illustrates an exemplary configuration of the Thomson scattering measurement system according to Embodiment 2 applied to the EUV light generation system 11.

The Thomson scattering measurement system illustrated in FIG. 22 includes, in addition to the configuration illustrated in FIG. 6, a wavelength filter 150 disposed between the cylindrical lens optical system 400 and the spectrometer 130. The wavelength filter 150 prevents light having a predetermined wavelength substantially identical to the wavelength $\lambda_0$ of the probe pulse laser beam 31P among light including the Thomson scattering light 31T from being incident on the spectrometer 130. The entire combination of the cylindrical lens optical system 400, the wavelength filter 150, and the spectrometer 130 may function as a spectrum measurement device configured to measure the spectrum waveform of the Thomson scattering light 31T corresponding to the ion term.

Figure 23:
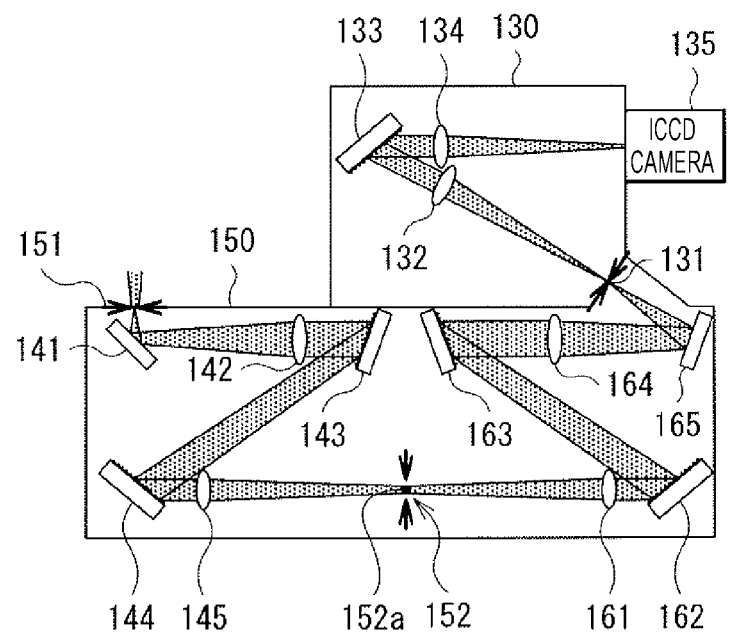
FIG. 23 schematically illustrates an exemplary configuration of a wavelength filter in the Thomson scattering measurement system according to Embodiment 2.

FIG. 23 schematically illustrates an exemplary configuration of the wavelength filter 150.

The wavelength filter 150 may include an entrance slit 151, a high reflectance mirror 141, a collimator optical system 142, a grating 143, a grating 144, a condensation optical system 145, and a middle slit 152. The wavelength filter 150 may also include a collimator optical system 161, a grating 162, a grating 163, a condensation optical system 164, and a high reflectance mirror 165.

The gratings 143 and 144 may be dispersion optical systems that spatially disperse light including the Thomson scattering light 31T in accordance with the wavelength. The gratings 143 and 144 may be dispersion gratings that diffract light including the Thomson scattering light 31T in accordance with the wavelength.

The entrance slit 151 may be disposed so that an image of plasma due to the Thomson scattering light 31T imaged through the cylindrical lens optical system 400 is incident on the entrance slit 151. The high reflectance mirror 141 may be disposed to highly reflect the Thomson scattering light 31T having transmitted through the entrance slit 151 so that the Thomson scattering light 31T is incident on the collimator optical system 142. The collimator optical system 142 may be disposed to convert light having transmitted through the entrance slit 151 into first collimate light. The grating 143 may be disposed so that the first collimate light is incident on the grating 143 at a predetermined incident angle $\alpha 1$ and diffracted substantially at the diffraction angle $\beta 1$. The grating 144 may be disposed so that the diffracted light due to the grating 143 is incident on the grating 144 at the predetermined incident angle $\alpha 1$ and diffracted substantially at the diffraction angle $\beta 1$. The condensation optical system 145 may be disposed to condense the diffracted light due to the grating 144.

Figure 24:
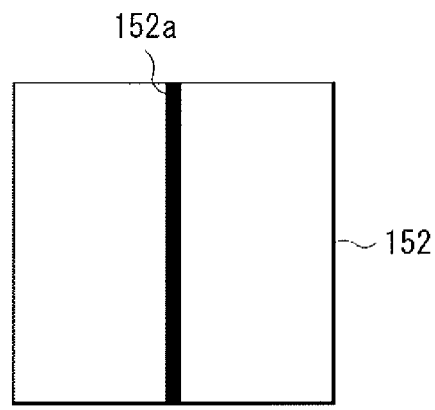
FIG. 24 schematically illustrates an exemplary configuration of a shield member of the wavelength filter in FIG. 23.

The middle slit 152 may include a shield member 152a configured to shield light having a predetermined wavelength among the dispersed light due to the gratings 143 and 144. As illustrated in FIG. 24, the shield member 152a may be linearly disposed at a substantially central part of the middle slit 152. The middle slit 152 may be disposed on a focal plane of the condensation optical system 145. The middle slit 152 may shield, by using the shield member 152a, light having the predetermined wavelength among the dispersed light due to the gratings 143 and 144, and may allow light incident on both sides of the shield member 152a to pass through the middle slit 152.

The gratings 162 and 163 may be inverse dispersion optical systems that spatially inversely disperse, in accordance with the wavelength, the dispersed light among which light having the predetermined wavelength is shielded by the shield member 152a. The gratings 162 and 163 may be inverse dispersion gratings that diffracts, in accordance with the wavelength, the dispersed light among which light having the predetermined wavelength is shielded by the shield member 152a.

The collimator optical system 161 may be disposed to convert light having passed through both sides of the shield member 152a into second collimate light. The grating 162 may be disposed so that the second collimate light is incident on the grating 162 at an incident angle $\beta 1$ and diffracted substantially at a diffraction angle $\alpha 1$. The grating 163 may be disposed so that the diffracted light due to the grating 162 is incident on the grating 163 at the predetermined incident angle $\beta 1$ and diffracted substantially at the diffraction angle $\alpha 1$. The condensation optical system 164 may be disposed to condense the diffracted light due to the grating 163. The high reflectance mirror 165 may be disposed so that the diffracted light having transmitted through the condensation optical system 164 is imaged on the entrance slit 131 of the spectrometer 130.

Optical elements included in the wavelength filter 150 and the spectrometer 130 may have specifications as follows. Lenses of the collimator optical systems 132, 142, and 161 and the condensation optical systems 134, 145, and 164 may have effective diameters of 60 mm and focal lengths of 486 mm, and may be provided with chromatic aberration correction in a measurement wavelength band. The gratings 133, 143, 144, 162, and 163 may be blazed gratings of 2400 lines/mm. The entrance slits 131 and 151 may have slit widths of 20 μm approximately. The shield member 152a may be a tungsten wire having a diameter of 100 μm.

The EUV light generation controller 5 may calculate the plasma parameter indicating a plasma characteristic from a measured spectrum waveform of the Thomson scattering light 31T corresponding to the ion term. The EUV light generation controller 5 may control the drive laser device 3D based on a detected value by an energy sensor 28 and the plasma parameter so that the drive pulse laser beam 31D has an optimized characteristic. The EUV light generation controller 5 may control the target supply device 70 based on the detected value by the energy sensor 28 and the plasma parameter so that the target 27 has an optimized target diameter.

The other configuration may be substantially same as that of the Thomson scattering measurement system according to the comparative example or Embodiment 1 described above.

[4.2 Operation]

In the Thomson scattering measurement system illustrated in FIG. 22, an image of plasma due to the Thomson scattering light 31T is formed on the entrance slit 151 of the wavelength filter 150 through the cylindrical lens optical system 400. The longitudinal direction of the opening of the entrance slit 151 of the wavelength filter 150 may substantially match with the axial direction of the drive pulse laser beam 31D. Light having transmitted through the entrance slit 151 is collimated by the collimator optical system 142 and diffracted by the gratings 143 and 144. The gratings 143 and 144 diffract and spatially disperse light including the Thomson scattering light 31T in accordance with the wavelength. An image of the entrance slit 151 is formed on the shield member 152a of the middle slit 152 by the condensation optical system 145 through the collimator optical system 142 and the gratings 143 and 144.

Among light incident on the middle slit 152, light having a predetermined wavelength substantially identical to the wavelength $\lambda_0$ of the probe pulse laser beam 31P is shielded by the shield member 152a. The Thomson scattering light 31T having a wavelength longer than the wavelength $\lambda_0$ of the probe pulse laser beam 31P by a predetermined wavelength range transmits through the middle slit 152. The light having transmitted through the middle slit 152 is collimated by the collimator optical system 161, and then diffracted and dispersed by the gratings 162 and 163 inversely to the dispersion by the gratings 143 and 144. This diffracted light passes through the high reflectance mirror 165 and is formed as an image of the entrance slit 151 on the entrance slit 131 of the spectrometer 130 through the condensation optical system 164. This diffracted light transmits through the entrance slit 131 of the spectrometer 130 and is formed as a diffraction image of the entrance slit 131 on the light-receiving surface of the ICCD camera 135 through the collimator optical system 132, the grating 133, and the condensation optical system 134.

(Measurement Result of Spectrum Waveform of Thomson Scattering Light 31T)

Figure 25:
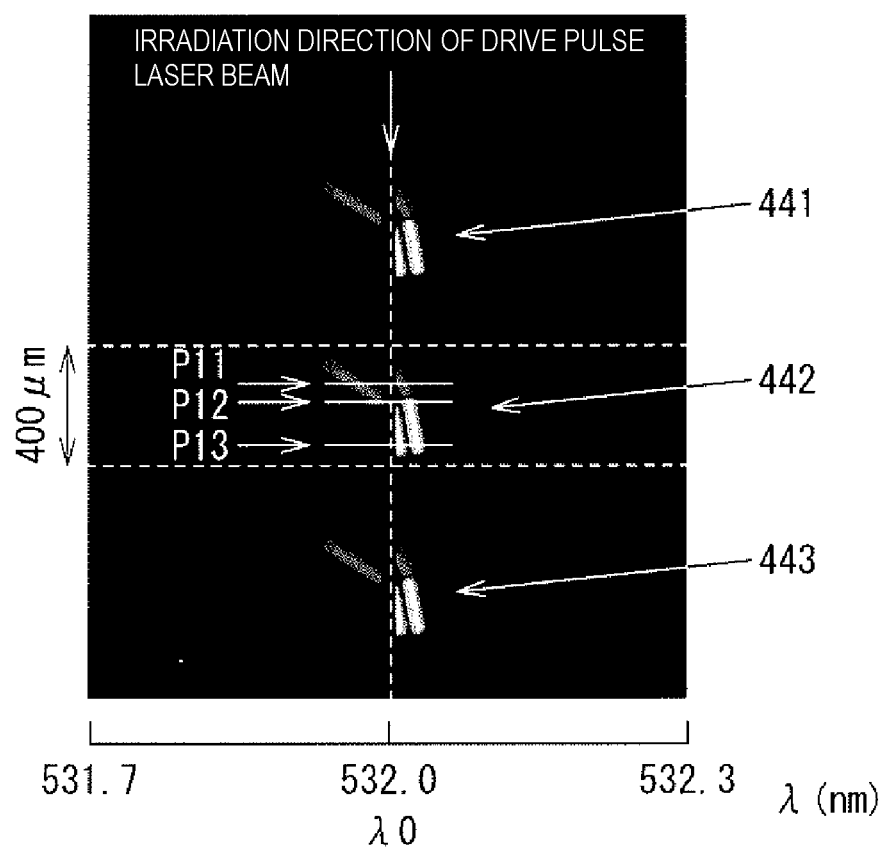
FIG. 25 schematically illustrates a spectrum image of the Thomson scattering light corresponding to the ion term in the Thomson scattering measurement system according to Embodiment 2.
Figure 26:
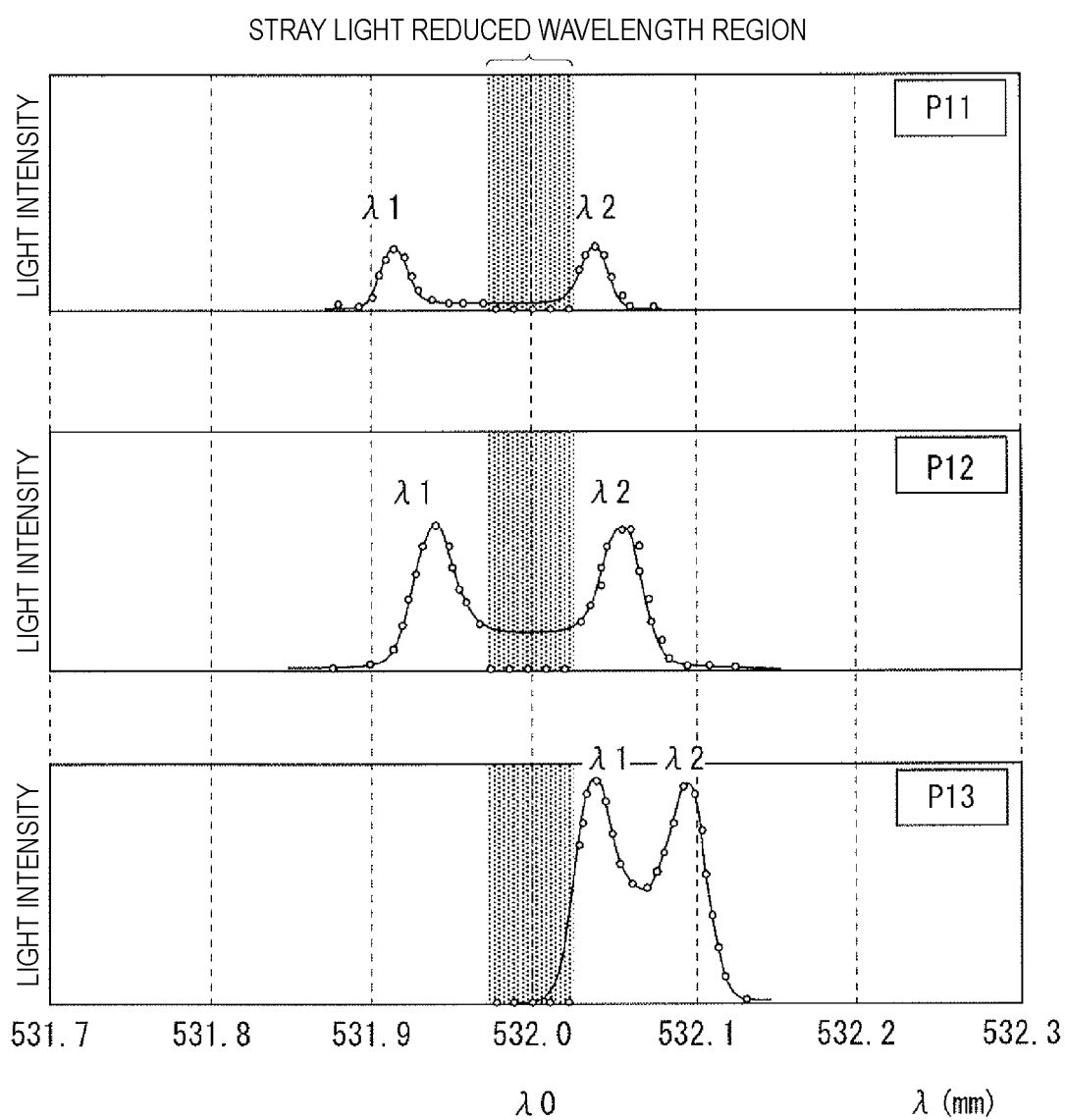
FIG. 26 schematically illustrates spectrum waveforms at positions P11, P12, and P13 in FIG. 25.

The following describes an exemplary measurement result of the spectrum waveform of the Thomson scattering light 31T corresponding to the ion term in Embodiment 2 with reference to FIGS. 25 and 26. The light emission state of the EUV light 252 may be substantially same as that described above with reference to FIG. 17. FIG. 25 schematically illustrates a spectrum image of the Thomson scattering light 31T corresponding to the ion term. In FIG. 25, the longitudinal direction represents position, and the lateral direction represents wavelength. FIG. 26 schematically illustrates spectrum waveforms of the Thomson scattering light 31T corresponding to the ion term at the respective positions P11, P12, and P13 in FIG. 25. As illustrated in FIG. 26, a stray light reduced wavelength region due to the wavelength filter 150 is generated near the wavelength $\lambda_0$ of the probe pulse laser beam 31P.

The other operation may be substantially same as that of the Thomson scattering measurement system according to the comparative example or Embodiment 1 described above.

[4.3 Effects]

According to the Thomson scattering measurement system according to Embodiment 2, a diffraction image of the entrance slit 151 is formed on the wavelength filter 150, and light having a predetermined wavelength is shielded by the shield member 152a to reduce stray light near the wavelength $\lambda_0$ of the probe pulse laser beam 31P. Then, light having the reduced stray light is dispersed by the spectrometer 130 to achieve highly accurate measurement of the spectrum waveform of the Thomson scattering light 31T corresponding to the ion term.

The other effects may be substantially same as those of the Thomson scattering measurement system according to the comparative example or Embodiment 1 described above.

5. Others

The above descriptions are intended to be illustrative only and not restrictive. Thus, it will be apparent to those skilled in the art that modifications may be made in the embodiments of the present disclosure without departing from the scope of the appended claims.

The terms used throughout the specification and the appended claims should be interpreted as "non-limiting". For example, the term "comprising" or "comprised" should be interpreted as "not limited to what has been described as being comprised". The term "having" should be interpreted as "not limited to what has been described as having". Further, the modifier "a/an" described in the specification and the appended claims should be interpreted to mean "at least one" or "one or more".

What is claimed is:

1. A Thomson scattering measurement system comprising:
   a probe laser device configured to output a probe pulse laser beam;
   a slit array including a plurality of first slits, provided on an optical path of Thomson scattering light generated by irradiation of a plasma region with the probe pulse laser beam, and configured to selectively allow the Thomson scattering light to pass through the first slits to divide the Thomson scattering light into a plurality of slit light beams each having a sectional longitudinal direction along a first direction of the plasma region and generate a slit light beam group of the slit light beams arrayed in a second direction intersecting the first direction;
   a transfer optical system provided on an optical path of the slit light beam group generated by division through the slit array and configured to transfer the slit light beam group to a plurality of transfer image groups separated from each other;
   a second slit provided on an optical path of light from the transfer image groups and configured to selectively allow light from a plurality of transfer images positioned on a straight line extending in a direction corresponding to the first direction to pass through the second slit, the transfer images corresponding to slit light beams at positions different from each other in the second direction in the slit light beam group among transfer images included in the transfer image groups; and a spectrometer configured to measure the spectrum waveform of the Thomson scattering light corresponding to an ion term based on the light having passed through the second slit from the transfer images.

2. The Thomson scattering measurement system according to claim 1, wherein
the transfer optical system includes a cylindrical lens array including a plurality of first cylindrical lenses disposed to have respective barrel axes separated from each other.

3. The Thomson scattering measurement system according to claim 2, wherein each first cylindrical lens is disposed so that an axis orthogonal to an optical path axis of the Thomson scattering light and the barrel axis of the first cylindrical lens is tilted relative to a longitudinal direction of each first slit with a rotation center at the optical path axis of the Thomson scattering light.

4. The Thomson scattering measurement system according to claim 3, wherein the first cylindrical lens has a tilt angle equal to or smaller than 5°.

5. The Thomson scattering measurement system according to claim 3, wherein the second slit is disposed to have a longitudinal direction tilted relative to the longitudinal direction of the first slit with a rotation center at the optical path axis of the Thomson scattering light.

6. The Thomson scattering measurement system according to claim 2, wherein the first cylindrical lenses are disposed in parallel to each other in the direction of the barrel axis of each first cylindrical lens.

7. The Thomson scattering measurement system according to claim 2, wherein the number of the first cylindrical lenses is equal to the number of the first slits.

8. The Thomson scattering measurement system according to claim 2, wherein
the cylindrical lens array includes a board, and
the first cylindrical lenses are bonded onto the board by a resin material.

9. The Thomson scattering measurement system according to claim 2, wherein each two of the first cylindrical lenses adjacent to each other are bonded to each other by a resin material.

10. The Thomson scattering measurement system according to claim 2, wherein the first cylindrical lenses are disposed to have a substantially equal interval between the barrel axes of each two of the first cylindrical lenses adjacent to each other.

11. The Thomson scattering measurement system according to claim 2, further comprising a condensation optical system through which the Thomson scattering light is condensed onto the slit array, wherein $\Delta x \geq \{N_A/(N_A+1)\} \times Wx$ holds, where Wx represents the size of each slit light beam in the longitudinal direction of the corresponding first slit on the slit array, $\Delta x$ represents the interval between the barrel axes of each two of the first cylindrical lenses adjacent to each other among the first cylindrical lenses, and $N_A$ represents the imaging magnification of the first cylindrical lens.

12. The Thomson scattering measurement system according to claim 2, wherein the transfer optical system further includes:

a second cylindrical lens disposed on an optical path between the slit array and the cylindrical lens array; and
a third cylindrical lens disposed on an optical path between the cylindrical lens array and the second slit.

13. The Thomson scattering measurement system according to claim 12, wherein the second cylindrical lens and the third cylindrical lens are disposed to have barrel axes substantially parallel to the longitudinal direction of each first slit.

14. The Thomson scattering measurement system according to claim 2, further comprising a wavelength filter disposed between the cylindrical lens array and the spectrometer to prevent light having a predetermined wavelength substantially identical to the wavelength of the probe pulse laser beam among light including the Thomson scattering light from being incident on the spectrometer.

15. The Thomson scattering measurement system according to claim 14, wherein the plasma is generated by irradiating a target with a drive pulse laser beam.

16. An EUV light generation system comprising:
a chamber;
a target supply device configured to supply a target into the chamber;
a drive laser device configured to generate plasma by irradiating the target with a drive pulse laser beam and generate EUV light from the plasma;
a probe laser device configured to output a probe pulse laser beam;
a slit array including a plurality of first slits, provided on an optical path of Thomson scattering light generated by irradiation of a plasma region with the probe pulse laser beam, and configured to selectively allow the Thomson scattering light to pass through the first slits to divide the Thomson scattering light into a plurality of slit light beams each having a sectional longitudinal direction along a first direction of the plasma region and generate a slit light beam group of the slit light beams arrayed in a second direction intersecting the first direction;
a transfer optical system provided on an optical path of the slit light beam group generated by division through the slit array and configured to transfer the slit light beam group to a plurality of transfer image groups separated from each other;
a second slit provided on an optical path of light from the transfer image groups and configured to selectively allow light from a plurality of transfer images positioned on a straight line extending in a direction corresponding to the first direction to pass through the second slit, the transfer images corresponding to slit light beams at positions different from each other in the second direction in the slit light beam group among transfer images included in the transfer image groups; and
a spectrometer configured to measure the spectrum waveform of the Thomson scattering light corresponding to an ion term based on the light having passed through the second slit from the transfer images.

17. The EUV light generation system according to claim 16, wherein the transfer optical system includes a cylindrical lens array including a plurality of first cylindrical lenses disposed to have respective barrel axes separated from each other.

* * * * *